(12) United States Patent
Koezuka et al.

(10) Patent No.: US 8,288,249 B2
(45) Date of Patent: Oct. 16, 2012

(54) METHOD FOR MANUFACTURING SOI SUBSTRATE

(75) Inventors: Junichi Koezuka, Kanagawa (JP); Hideto Ohnuma, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 13/011,136

(22) Filed: Jan. 21, 2011

(65) Prior Publication Data

US 2011/0183494 A1    Jul. 28, 2011

(30) Foreign Application Priority Data

Jan. 26, 2010 (JP) ................. 2010-014862

(51) Int. Cl.
*H01L 21/30* (2006.01)
*H01L 21/46* (2006.01)
(52) U.S. Cl. ................. 438/458; 257/E21.568
(58) Field of Classification Search ............ 438/458; 257/E21.568
See application file for complete search history.

(56) References Cited

U.S. PATENT DOCUMENTS

| | | | |
|---|---|---|---|
| 5,374,564 A | 12/1994 | Bruel | |
| 6,372,609 B1 | 4/2002 | Aga et al. | |
| RE39,484 E | 2/2007 | Bruel | |
| 7,300,853 B2 | 11/2007 | Joly et al. | |
| 7,674,687 B2 | 3/2010 | Henley | |
| 2008/0038908 A1 | 2/2008 | Henley | |
| 2008/0286952 A1* | 11/2008 | Miyairi et al. | ........ 438/517 |
| 2008/0311726 A1* | 12/2008 | Ohnuma et al. | ........ 438/455 |
| 2010/0087044 A1 | 4/2010 | Shichi et al. | |
| 2010/0126587 A1 | 5/2010 | Henley | |
| 2010/0129950 A1 | 5/2010 | Henley | |
| 2010/0129951 A1 | 5/2010 | Henley | |
| 2010/0291752 A1 | 11/2010 | Okuno | |

FOREIGN PATENT DOCUMENTS

JP     H05-211128     8/1993

* cited by examiner

*Primary Examiner* — Alexander G. Ghyka
*Assistant Examiner* — Stanetta Isaac
(74) *Attorney, Agent, or Firm* — Nixon Peabody LLP; Jeffrey L. Costellia

(57) ABSTRACT

Manufacturing cost of an SOI substrate is reduced. Yield of an SOI substrate is improved. A method for manufacturing an SOI substrate includes the steps of irradiating a single crystal semiconductor substrate with ions to form an embrittled region in the single crystal semiconductor substrate, bonding the single crystal semiconductor substrate to a base substrate with an insulating film therebetween, and separating the single crystal semiconductor substrate and the base substrate at the embrittled region to form a semiconductor layer over the base substrate with the insulating film therebetween. In the step of forming the embrittled region, ion species which are not mass-separated are used as the ions and a temperature of the single crystal semiconductor substrate is set to 250° C. or higher at the time of irradiation with the ions.

21 Claims, 12 Drawing Sheets

METHOD FOR MANUFACTURING SOI SUBSTRATE

BACKGROUND OF THE INVENTION

1. Field of the Invention

The invention disclosed in this specification relates to a method for manufacturing a substrate provided with a semiconductor layer. Further, the invention relates to a method for manufacturing a substrate provided with a semiconductor layer with an insulating layer therebetween, and particularly relates to a method for manufacturing an SOI (silicon on insulator) substrate. The invention also relates to a method for manufacturing a semiconductor device including any of these substrates.

2. Description of the Related Art

In recent years, a single-crystalline film (typically, an SOI substrate) has been actively developed instead of a bulk silicon wafer (for example, see Patent Document 1). In the case where an integrated circuit is formed using an SOI substrate, parasitic capacitance between a drain of a transistor and a substrate is reduced, whereby performance of a semiconductor integrated circuit can be improved.

REFERENCE

Patent Document

[Patent Document 1] Japanese Published Patent Application No. H05-211128

SUMMARY OF THE INVENTION

As described above, an integrated circuit formed using an SOI substrate has excellent performance; however, manufacturing cost thereof is high, owing to use of a silicon wafer in forming an SOI substrate, or the like. In order to reduce the manufacturing cost, improve in yield is required.

In view of the above problems, an object of one embodiment of the invention disclosed in this specification is to reduce manufacturing cost of an SOI substrate. Alternatively, an object is to improve yield of an SOI substrate. Note that it is acceptable as long as one embodiment of the present invention can achieve at least one of the above objects.

In order to achieve the above objects, one embodiment of the invention disclosed in this specification employs the following structure. One illustrative embodiment of the present invention is a method for manufacturing an SOI substrate including the steps of irradiating a single crystal semiconductor substrate with ions to form an embrittled region in the single crystal semiconductor substrate, bonding the single crystal semiconductor substrate to a base substrate with an insulating film therebetween, and separating the single crystal semiconductor substrate and the base substrate at the embrittled region to form a semiconductor layer over the base substrate with the insulating film therebetween. In the step of forming the embrittled region, ion species which are not mass-separated are used as the ions and the temperature of the single crystal semiconductor substrate is set to 250° C. or higher at the time of irradiation with the ions.

One illustrative embodiment of the present invention is a method for manufacturing an SOI substrate including the steps of exciting a source gas to generate plasma, accelerating ions included in the plasma without mass separation, irradiating a single crystal semiconductor substrate with the accelerated ions with the temperature of the single crystal semiconductor substrate set to 250° C. or higher so as to form an embrittled region in the single crystal semiconductor substrate, bonding the single crystal semiconductor substrate to a base substrate with an insulating film therebetween, and separating the single crystal semiconductor substrate and the base substrate at the embrittled region to form a semiconductor layer over the base substrate with the insulating film therebetween.

One illustrative embodiment of the present invention is a method for manufacturing an SOI substrate including the steps of irradiating a single crystal silicon substrate with hydrogen ions to form an embrittled region in the single crystal silicon substrate, bonding the single crystal silicon substrate to a base substrate with an insulating film therebetween, and separating the single crystal silicon substrate and the base substrate at the embrittled region to form a silicon layer over the base substrate with the insulating film therebetween. In the step of forming the embrittled region, irradiation with the hydrogen ions is performed so that there is a maximum peak around 2110 $cm^{-1}$ or 2155 $cm^{-1}$ when evaluation of a Si—H bond in the embrittled region is performed by Fourier transform infrared spectroscopy.

One illustrative embodiment of the present invention is a method for manufacturing an SOI substrate including the steps of forming an insulating film on at least one surface of a single crystal semiconductor substrate, irradiating the single crystal semiconductor substrate with ions to form an embrittled region in the single crystal semiconductor substrate, bonding the single crystal semiconductor substrate to a base substrate with the insulating film therebetween, and separating the single crystal semiconductor substrate and the base substrate at the embrittled region to form a semiconductor layer over the base substrate with the insulating film therebetween. In the step of forming the embrittled region, ion species which are not mass-separated are used as the ions and the temperature of the single crystal semiconductor substrate is set to 250° C. or higher at the time of irradiation with the ions. Here, the insulating film may be formed by thermal oxidation of at least one surface of the single crystal semiconductor substrate.

One illustrative embodiment of the present invention is a method for manufacturing an SOI substrate including the steps of irradiating a single crystal semiconductor substrate with ions to form an embrittled region in the single crystal semiconductor substrate, forming an insulating film over a base substrate, bonding the single crystal semiconductor substrate to the base substrate with the insulating film therebetween, and separating the single crystal semiconductor substrate and the base substrate at the embrittled region to form a semiconductor layer over the base substrate with the insulating film therebetween. In the step of forming the embrittled region, ion species which are not mass-separated are used as the ions and the temperature of the single crystal semiconductor substrate is set to 250° C. or higher at the time of irradiation with the ions.

According to one illustrative embodiment of the present invention, ions including a hydrogen element are used as the ions and a proportion of $H_3^+$ is 70% or higher with respect to the total number of the ions.

According to one illustrative embodiment of the present invention, the temperature of the single crystal semiconductor substrate is set to be higher than or equal to 250° C. and lower than or equal to 400° C. at the time of irradiation with the ions.

According to one illustrative embodiment of the present invention, a glass substrate is used as the base substrate.

According to one illustrative embodiment of the present invention, the semiconductor layer includes a single crystal.

In this specification, a "single crystal" refers to a crystal in which, when a certain crystal axis is focused, the direction of the crystal axis is oriented in the same direction in any portion of a sample and which has no crystal grain boundary between crystals. Further, in this specification, the "single crystal" includes a crystal in which directions of crystal axes are uniform and which has no grain boundary as described above even when it includes a crystal defect or a dangling bond.

A "semiconductor device" in this specification refers to all devices which can operate by utilizing semiconductor characteristics, and electro-optical devices, semiconductor circuits, and electronic devices are all semiconductor devices.

According to one embodiment of the present invention, yield of an SOI substrate can be improved. As a result, manufacturing cost of an SOI substrate can be reduced.

BRIEF DESCRIPTION OF THE DRAWINGS

FIG. 2 is a cross-sectional view illustrating an example of a method for manufacturing an SOI substrate.

FIGS. 3A-1 to 3A-3, 3B-1 and 3B-2, 3C, and 3D are cross-sectional views illustrating an example of a method for manufacturing an SOI substrate.

DETAILED DESCRIPTION OF THE INVENTION

Figures 1, 1A:
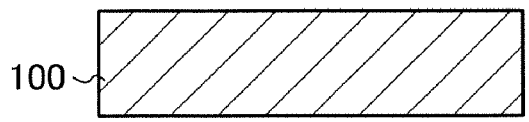
FIGS. 1A-1 to 1A-3, 1B-1, 1C, and 1D are cross-sectional views illustrating an example of a method for manufacturing an SOI substrate.

Embodiments and an example of the present invention will be described in detail with reference to the accompanying drawings. Note that the present invention is not defined to description below, and it is easily understood by those skilled in the art that modes and details can be modified in various ways without departing from the purpose and the scope of the present invention. Therefore, the present invention should not be construed as being limited to the description of the embodiments and the example. Note that in the embodiments of the present invention to be described below, the same reference numerals are used to denote the same components in different drawings.

Furthermore, each of the embodiments and example described below can be implemented in appropriate combination with any of the other embodiments and example described in this specification unless otherwise noted.

Embodiment 1

In this embodiment, an example of a method for manufacturing a substrate provided with a semiconductor layer will be described. Specifically, a method for manufacturing a substrate over which a single crystal silicon layer is provided with an insulating layer therebetween (a method for manufacturing an SOI substrate) will be described.

Figures 1, 1A, 2:
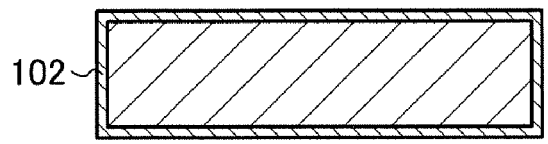
Figures 1, 1B:
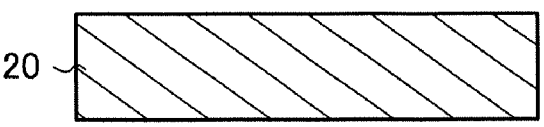

First, a single crystal semiconductor substrate 100 and a base substrate 120 are prepared (see FIGS. 1A-1 and 1B-1).

As the single crystal semiconductor substrate 100, a single crystal semiconductor substrate formed using an element belonging to Group 14 of the periodic table, such as a single crystal silicon substrate, a single crystal germanium substrate, or a single crystal silicon germanium substrate, or a compound semiconductor substrate of gallium arsenide, indium phosphide, or the like can be used. Typical examples of commercially available silicon substrates are circular silicon substrates which are 5 inches (125 mm) in diameter, 6 inches (150 mm) in diameter, 8 inches (200 mm) in diameter, 12 inches (300 mm) in diameter, and 16 inches (400 mm) in diameter, and a silicon substrate having any of these sizes can be used. Note that the shape of the single crystal semiconductor substrate 100 is not limited to a circular shape, and a single crystal semiconductor substrate processed into a rectangular shape or the like can also be used. In this embodiment, the case where a single crystal silicon substrate is used as the single crystal semiconductor substrate 100 is described.

As the base substrate 120, an insulating substrate is preferably used. As specific examples of an insulating substrate, a variety of glass substrates that are used in the electronics industry, such as aluminosilicate glass substrates, aluminoborosilicate glass substrates, and barium borosilicate glass substrates; quartz substrates; ceramic substrates; sapphire substrates; and plastic substrates can be given. Although a single crystal semiconductor substrate (e.g., a single crystal silicon substrate) or a polycrystalline semiconductor substrate (e.g., a polycrystalline silicon substrate) can also be used as the base substrate 120, an insulating substrate which can have a larger size and is inexpensive is preferably used, in consideration of mass productivity and cost. In this embodiment, a description is given of the case where a glass substrate which is one of insulating substrates is used as the base substrate 120.

Next, an insulating layer 102 is formed on a surface of the single crystal semiconductor substrate 100 (see FIG. 1A-2).

As specific examples of a material for forming the insulating layer 102, a silicon oxide film, a silicon oxynitride film, a silicon nitride film, a silicon nitride oxide film, and the like can be given. An insulating layer formed using any of these materials may have a single-layer structure or a stacked-layer structure. In this specification, "silicon oxynitride" contains more oxygen than nitrogen, and in the case where measurements are performed using Rutherford backscattering spectrometry (RBS) and hydrogen forward scattering (HFS), silicon oxynitride preferably contains oxygen, nitrogen, silicon, and hydrogen at concentrations ranging from 50 atomic % to 70 atomic %, 0.5 atomic % to 15 atomic %, 25 atomic % to 35 atomic %, and 0.1 atomic % to 10 atomic %, respectively. Further, in this specification, "silicon nitride oxide" contains more nitrogen than oxygen, and in the case where measurement is conducted using RBS and HFS, silicon nitride oxide preferably contains oxygen, nitrogen, silicon, and hydrogen at concentrations ranging from 5 atomic % to 30 atomic %, 20 atomic % to 55 atomic %, 25 atomic % to 35 atomic %, and 10 atomic % to 30 atomic %, respectively. Note that percentages of nitrogen, oxygen, silicon, and hydrogen fall within the ranges given above, where the total number of atoms contained in the silicon oxynitride or the silicon nitride oxide is defined as 100 atomic %.

As specific examples of a method for forming the insulating layer 102, a thermal oxidation method, a CVD method, and a sputtering method can be given.

For example, in the case where the insulating layer 102 is formed by a CVD method, a silicon oxide film formed by using organosilane such as tetraethoxysilane (abbreviation: TEOS, chemical formula: $Si(OC_2H_5)_4$) is preferably used as the insulating layer 102 in terms of productivity.

In the case where the insulating layer 102 (here, a $SiO_x$ film) is formed by a thermal oxidation method, thermal oxidation is preferably performed in an oxidizing atmosphere containing oxygen ($O_2$) as a main component, and halogen. For example, the thermal oxidation treatment is performed on the single crystal semiconductor substrate 100 in an oxidizing atmosphere containing chlorine (Cl), whereby the insulating layer 102 is formed through chlorine oxidation. In this case, the insulating layer 102 is an insulating layer containing chlorine atoms. The chlorine atoms contained in the insulating layer 102 cause distortions. As a result, the moisture absorptance of the insulating layer 102 is improved and diffusion rate of moisture is increased. That is, when moisture is present on a surface of the insulating layer 102, the moisture present on the surface can be rapidly absorbed and diffused into the insulating layer 102.

As an example of the thermal oxidation treatment, thermal oxidation can be performed in an oxidizing atmosphere which contains hydrogen chloride (HCl) at a proportion of 0.5 volume % to 10 volume % (typically, 3 volume %) with respect to oxygen at a temperature of 900° C. to 1150° C. (typically, 1000° C.). The treatment time may be 0.1 hours to 6 hours, preferably 0.5 hours to 1 hour. The thickness of an oxide film formed by the thermal oxidation treatment may be 10 nm to 1000 nm (preferably, 50 nm to 300 nm), for example, 100 nm.

In this embodiment, the thermal oxidation treatment is performed on the single crystal semiconductor substrate 100 in an oxidizing atmosphere containing chlorine (Cl), so that the insulating layer 102 is formed to contain chlorine atoms at a concentration of $1\times10^{17}$ atoms/cm$^3$ to $1\times10^{21}$ atoms/cm$^3$. Chlorine atoms are contained in the insulating layer 102, whereby a heavy metal (such as Fe, Cr, Ni, or Mo) which is an extrinsic impurity is captured and thus the single crystal semiconductor substrate 100 can be prevented from being contaminated.

When a halogen atom is contained in the insulating layer 102, an impurity which has an adverse effect on the single crystal semiconductor substrate (for example, a mobile ion such as Na) can be gettered. That is, by heat treatment which is performed after the insulating layer 102 is formed, the impurity contained in the single crystal semiconductor substrate is separated out to the insulating layer 102 and reacts with halogen (for example, chlorine) to be captured. Accordingly, the impurity captured in the insulating layer 102 can be fixed and prevented from contaminating the single crystal semiconductor substrate 100. Further, when the insulating layer 102 is bonded to a glass substrate, the insulating layer 102 can serve as a film for fixing an impurity such as Na contained in glass. In particular, containing a halogen atom such as a chlorine atom in the insulating layer 102 by HCl oxidation or the like is effective in the case where the semiconductor substrate is not sufficiently cleaned or in removing contamination of the semiconductor substrate which is repeatedly reused.

A halogen atom to be contained in the insulating layer 102 is not limited to a chlorine atom, and a fluorine atom may be contained in the insulating layer 102, for example. The surface of the single crystal semiconductor substrate 100 can be oxidized with fluorine by thermal oxidation treatment in an oxidizing atmosphere after immersion of the surface of the single crystal semiconductor substrate 100 into hydrofluoric acid or by thermal oxidation treatment in an oxidizing atmosphere to which $NF_3$ is added.

Next, the single crystal semiconductor substrate 100 is irradiated with ions 103 having kinetic energy through the insulating layer 102, whereby an embrittled region 104 having a damaged crystal structure is formed at a predetermined depth from the surface of the single crystal semiconductor substrate 100 (see FIG. 1A-3).

The first feature of one embodiment of the present invention is that the single crystal semiconductor substrate 100 is irradiated with the ions 103 which are not mass-separated, with the use of an ion doping apparatus. A typical ion doping apparatus is a non-mass-separation type apparatus for irradiating an object to be processed that is disposed in a chamber with all kinds of ion species which are generated by plasma excitation of a process gas. In this specification, a method in which an object (here, the single crystal semiconductor substrate 100) is irradiated, with the use of an ion doping apparatus, with ions which are generated from a source gas (material gas) and not mass-separated is referred to as an "ion doping method".

Main components of an ion doping apparatus are as follows: a chamber in which an object is placed; an ion source for generating desired ions; and an acceleration mechanism for acceleration of ions for irradiation therewith. The ion source includes a gas supply device for supplying a source gas to generate desired ion species, an electrode for exciting the source gas to generate plasma, and the like. As the electrode for generating plasma, a filament electrode, a capacitively-coupled high-frequency discharge electrode, or the like is used. The acceleration mechanism includes electrodes such as an extraction electrode, an acceleration electrode, a deceleration electrode, and a ground electrode; a power source for supplying power to these electrodes; and the like. These electrodes included in the acceleration mechanism are provided with a plurality of openings or slits, through which ions that are generated in the ion source are accelerated. Note that components of the ion doping apparatus are not limited to the components described above and a mechanism according to need is provided.

Note that examples of an apparatus for ion irradiation include an ion implantation apparatus in addition to an ion doping apparatus. An ion implantation apparatus is an apparatus for mass-separating ion species in plasma and irradiating an object with an ion species having a predetermined mass (a mass-separation type apparatus), and is significantly different from an ion doping apparatus in this respect.

Next, a method for forming the embrittled region 104 will be described.

First, a source gas (material gas) is excited using an ion doping apparatus, so that plasma of the source gas is generated. Then, the ions 103 included in this plasma are extracted from the plasma, without mass separation, by the action of an electric field and accelerated. The single crystal semiconductor substrate 100 is irradiated with the accelerated ions 103, whereby the embrittled region 104 is formed.

In this embodiment, a gas containing hydrogen (for example, $H_2$) is used as the source gas. Plasma is generated by excitation of the gas containing hydrogen. The ions 103 included in the plasma are accelerated without mass separation and the single crystal semiconductor substrate 100 is irradiated with the accelerated ions 103. In this case, ion species included in the plasma without being mass-separated include $H^+$, $H_2^+$, and $H_3^+$. Here, it is preferable that the single crystal semiconductor substrate 100 be irradiated with the ions 103 so that the proportion of $H_3^+$ is 50% or higher, more preferably 70% or higher, with respect to the total amount of ion species generated from the gas containing hydrogen ($H^+$, $H_2^+$, and $H_3^+$). As described above, mass separation is not performed in an ion doping apparatus; however, when the single crystal semiconductor substrate 100 is irradiated with the ions 103 including ions having the same mass at a proportion as high as possible, ions can be added in a concentrated manner to the same depth in the single crystal semiconductor substrate 100.

The depth of a region where the embrittled region 104 is formed can be adjusted by kinetic energy, mass, charge, and incident angle of the ions 103. Here, the kinetic energy can be adjusted by acceleration voltage. Since the embrittled region 104 is formed at almost the same depth as the average penetration depth of the ions 103, the thickness of a single crystal semiconductor layer which is to be separated from the single crystal semiconductor substrate 100 is determined by the depth to which the ions 103 are added. In this embodiment, the depth at which the embrittled region 104 is formed is adjusted so that the thickness of the single crystal semiconductor layer is greater than or equal to 10 nm and less than or equal to 500 nm, preferably greater than or equal to 50 nm and less than or equal to 200 nm.

In order to form the embrittled region 104 at a short distance from the surface, the acceleration voltage for the ions 103 needs to be low; however, in the case where a gas containing hydrogen is used as the source gas, by an increase in the proportion of $H_3^+$ in the plasma, the single crystal semiconductor substrate 100 can be irradiated with the ions 103 efficiently. Since the mass of $H_3^+$ is three times as large as that of $H^+$, when hydrogen atoms are added to a region at the same depth, the acceleration voltage for $H_3^+$ can be three times as large as that for $H^+$. When the acceleration voltage for ions can be increased, the takt time of an ion irradiation step can be shortened, and productivity and throughput can be improved.

Ion doping apparatuses are inexpensive and excellent for use in large-area treatment. Therefore, by irradiation with $H_3^+$ with the use of such an ion doping apparatus, significant effects such as an increase in area, a reduction in costs, and an improvement in productivity can be obtained. Further, in the case where an ion doping apparatus is used, heavy metal may also be introduced into the single crystal semiconductor substrate 100 at the same time as the ion irradiation; however, by irradiation with ions through the insulating layer 102 containing chlorine atoms, the single crystal semiconductor substrate 100 can be prevented from being contaminated by the heavy metal. Therefore, in this embodiment, the embrittled region 104 is preferably formed using an ion doping apparatus after an insulating layer containing chlorine atoms is formed on the surface of the single crystal semiconductor substrate 100 as the insulating layer 102.

The second feature of one embodiment of the present invention is that the temperature of the single crystal semiconductor substrate 100 is set to a temperature higher than 250° C. when the single crystal semiconductor substrate 100 is irradiated with ions using an ion doping apparatus.

In the case where the temperature of the single crystal semiconductor substrate 100 is lower than a predetermined temperature when the single crystal semiconductor substrate 100 is irradiated with ions, the relationship between the dose of the ions and the concentration of ions in the embrittled region 104 which is irradiated with ions is an almost proportional relationship. On the other hand, as the temperature of the single crystal semiconductor substrate 100 becomes higher than the predetermined temperature when the single crystal semiconductor substrate 100 is irradiated with ions, less proportional relationship is seen and the concentration of ions in the embrittled region 104 which is irradiated with ions tends to become lower gradually with respect to the dose of the ions. This is seemingly because the ions used for irradiation partly diffuse (are released) outside the single crystal semiconductor substrate 100 (diffuse outward) as gas when the temperature of the single crystal semiconductor substrate 100 becomes higher than the predetermined temperature.

The present inventors have made researches diligently. As a result, the present inventors have found that the yield of an SOI substrate is improved when the embrittled region is formed in such a manner that ions partly diffuse outward as gas at the time of ion doping. Further, the present inventors found that the temperature of the single crystal semiconductor substrate 100 is preferably set to 250° C. or higher so that ions partly diffuse outward as gas at the time of ion doping.

When the temperature of the single crystal semiconductor substrate 100 is set too high at the time of ion doping, a crack may be generated in the embrittled region at the same time as the embrittled region 104 is formed. Accordingly, the maximum temperature of the single crystal semiconductor substrate 100 at the time of ion doping may be set to 500° C. or lower, preferably 460° C. or lower, more preferably 400° C. or lower.

With the use of the above-described method, the embrittled region 104 can be formed to be optimal for manufacturing an SOI substrate with high yield.

Next, the base substrate 120 is prepared (see FIG. 1B-1). It is preferable that a surface of the base substrate 120 be cleaned in advance before the base substrate 120 is used. Specifically, ultrasonic cleaning is performed on the surface of the base substrate 120 using a hydrochloric acid/hydrogen peroxide mixture (HPM), a sulfuric acid/hydrogen peroxide mixture (SPM), an ammonium hydroxide/hydrogen peroxide mixture (APM), diluted hydrogen fluoride (DHF), or the like. By such cleaning treatment, the surface of the base substrate 120 can be planarized and abrasive particles remaining on the surface can be removed.

Figures 1, 1A, 2, 3:
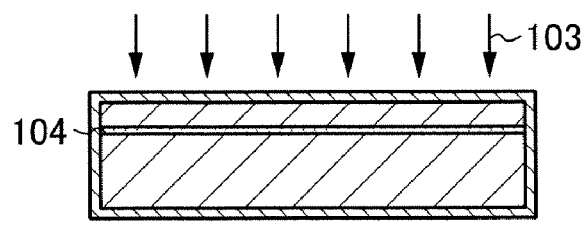
Figure 1C:
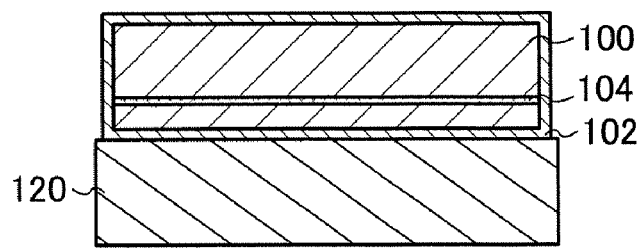

Next, the single crystal semiconductor substrate 100 and the base substrate 120 are bonded to each other with the insulating layer 102 therebetween (see FIG. 1C).

Figure 1D:
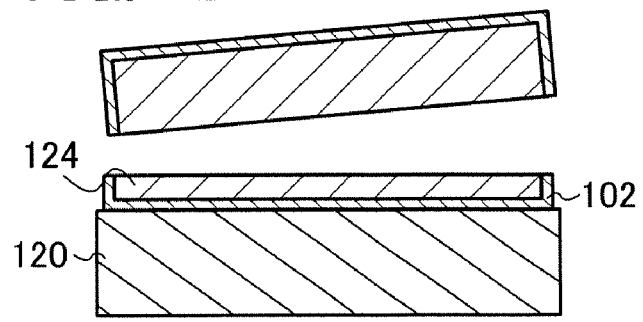
Figure 2:
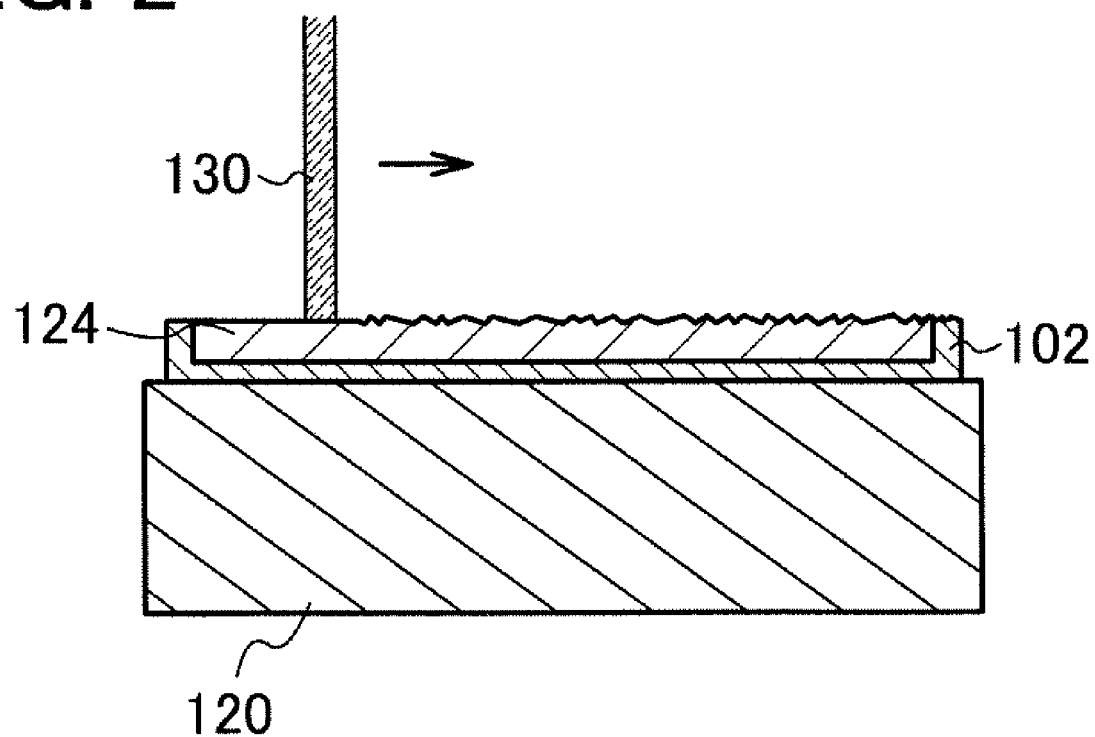

Next, heat treatment is performed to separate the single crystal semiconductor substrate 100 at the embrittled region 104, whereby a single crystal semiconductor layer 124 is provided over the base substrate 120 with the insulating layer 102 therebetween (see FIG. 1D). By the heat treatment, microvoids are formed in the embrittled region 104, an element added by the ion irradiation is separated out into the microvoids, and the internal pressure of the microvoids is increased. By the increase in pressure, the microvoids in the embrittled region 104 are changed in volume and a crack is generated in the embrittled region 104. Thus, the single crystal semiconductor substrate 100 is separated along the embrittled region 104. As a result, the single crystal semiconductor layer 124 which is separated from the single crystal semiconductor substrate 100 is formed over the base substrate 120 with the insulating layer 102 therebetween. The thickness of the single crystal semiconductor layer 124 which is formed after the separation may be, for example, greater than or equal to 10 nm and less than or equal to 500 nm, preferably greater than or equal to 50 nm and less than or equal to 200 nm. Note that as a heating unit for performing the heat treatment, a heating furnace such as a resistance heating furnace, a rapid thermal annealing (RTA) apparatus, a microwave heating apparatus, or the like can be used. For example, in the case where an RTA apparatus is used, the heat treatment may be performed at a heating temperature of higher than or equal to 550° C. and lower than or equal to 730° C. for a treatment time of greater than or equal to 0.5 minutes and less than or equal to 60 minutes.

In one embodiment of the present invention, the embrittled region 104 is formed using the above method; thus, a defect in transferring of part of a semiconductor thin film can be prevented from being caused in the separation step. In addition to preventing a defect in transferring of part of the semiconductor thin film from being caused in the separation step, unevenness on a surface of the single crystal semiconductor layer 124 immediately after the separation step can be reduced.

Next, a step for planarizing the surface of the single crystal semiconductor layer 124 (hereinafter referred to as a "planarization step") is performed as needed. For example, the surface of the single crystal semiconductor layer 124 which is formed over the base substrate 120 is irradiated with laser light 130, whereby the surface of the single crystal semiconductor layer 124 is planarized (see FIG. 2).

The irradiation with the laser light 130 may be performed on a desired region in the single crystal semiconductor layer 124, where planarization is needed. Accordingly, the entire surface of the single crystal semiconductor layer 124 may be irradiated with the laser light 130 so that the entire surface of the single crystal semiconductor layer 124 is planarized, or part of the single crystal semiconductor layer 124 may be irradiated with the laser light 130 so that the part irradiated with the laser light 130 is selectively planarized. The irradiation with the laser light 130 may be performed once or plural times (for example, 5 times to 20 times) on the desired region where planarization is needed. Note that in the case where the desired region where planarization is needed is irradiated plural times with the laser light 130, the irradiation is preferably performed without scanning the laser light (in other words, so that the overlap ratio is 100%).

There is no particular limitation on the shape of a beam spot of the laser light 130, and the beam spot may have any shape. For example, the beam spot may have a rectangular (linear) shape, a square shape, an elliptical shape, or a circular shape, typically a rectangular (linear) shape.

In general, the planarity of a superficial part of the single crystal semiconductor layer 124 provided over the base substrate 120 after the separation is impaired because of unevenness caused at the time of the formation of the embrittled region 104, the separation along the embrittled region 104, and the like. In this embodiment, as illustrated in FIG. 2, the single crystal semiconductor layer 124 is irradiated with the laser light 130 from the side of the surface of the single crystal semiconductor layer 124 having unevenness, so that the superficial part of the single crystal semiconductor layer 124 is melted and the planarity thereof can be improved. Note that the single crystal semiconductor layer 124 can be irradiated with laser light while the base substrate 120 provided with the single crystal semiconductor layer 124 is heated. As the heating temperature in this case, a temperature lower than or equal to the strain point of the base substrate 120 may be employed. For example, in the case where the base substrate 120 is a glass substrate, heating may be performed at a temperature in the range of higher than or equal to 300° C. and lower than or equal to 700° C.

In the planarization step, the energy density of the laser light 130 with which the single crystal semiconductor layer 124 is irradiated is preferably lower than the energy density at which the crystal structure of the single crystal semiconductor layer 124 is changed by the irradiation with the laser light 130. This is because when the energy density of the laser light 130 with which the single crystal semiconductor layer 124 is irradiated is too high, the single crystal semiconductor layer 124 is completely melted (complete melting) and the crystal structure thereof is changed (microcrystallization), whereby unevenness is caused on a surface of a semiconductor film. In this specification, "complete melting" refers to a phenomenon in which the depth to which the single crystal semiconductor layer 124 is melted by the irradiation with the laser light 130 becomes equal to the distance in a depth direction from an interface between the single crystal semiconductor layer 124 and the insulating layer 102 to the surface of the single crystal semiconductor layer 124 (the thickness of the single crystal semiconductor layer 124). In other words, it refers to a state where the whole single crystal semiconductor layer 124 is melted to be brought into a liquid phase.

Thus, in the planarization step, it is preferable that the single crystal semiconductor layer 124 be not completely melted, and that the single crystal semiconductor layer 124 be irradiated from the surface side with the laser light 130 having an energy density for partially melting the single crystal semiconductor layer 124 (partial melting) so that the surface thereof is planarized. In this specification, "partial melting" refers to a phenomenon in which the depth to which the single crystal semiconductor layer 124 is melted by the irradiation with the laser light 130 becomes shallower than the distance in a depth direction from the interface between the single crystal semiconductor layer 124 and the insulating layer 102 to the surface of the single crystal semiconductor layer 124 (the thickness of the single crystal semiconductor layer 124). That is, the upper part of the single crystal semiconductor layer 124 is melted to be brought into a liquid phase whereas the lower part thereof is not melted and remains as a solid-phase single crystal semiconductor.

When the single crystal semiconductor layer 124 is partially melted, crystals in a portion melted by the irradiation with the laser light 130 grow in accordance with a plane orientation of a non-melted portion of the single crystal semiconductor layer. Therefore, change in the crystal structure (microcrystallization) of the single crystal semiconductor layer 124 can be suppressed as compared with the case of complete melting, and the surface thereof can be planarized.

Furthermore, the energy density of the laser light with which the single crystal semiconductor layer 124 is irradiated is preferably set to an energy density such that the single crystal semiconductor layer 124 is not completely melted (that is, partially melted) in consideration of the wavelength of the laser light, the skin depth of the laser light, the thickness of the single crystal semiconductor layer 124, and the like. In other words, the energy density of the laser light with which the single crystal semiconductor layer 124 is irradiated is preferably set to be lower than the minimum energy density needed for completely melting the single crystal semiconductor layer 124.

Specifically, when the minimum energy density needed for completely melting the single crystal semiconductor layer 124 by the irradiation with the laser light is 100%, the single crystal semiconductor layer 124 is irradiated with laser light having energy density which does not exceed 100% at maximum, so that complete melting of the single crystal semiconductor layer 124 can be prevented. The maximum value is preferably 98%, more preferably 96%. Since complete melting of the single crystal semiconductor layer 124 due to the irradiation with the laser light can be prevented by setting such a maximum value, the surface of the single crystal semiconductor layer 124 can be sufficiently planarized.

Further, when the minimum energy density needed for completely melting the single crystal semiconductor layer 124 by the irradiation with the laser light is 100%, the minimum value is preferably 72%, more preferably 85%. When the single crystal semiconductor layer 124 is irradiated with laser light having energy density of at least 72% or higher, the surface thereof can be sufficiently planarized.

Thus, when the minimum energy density of the laser light needed for completely melting the single crystal semiconductor layer 124 is 100%, the energy density of the laser light with which the single crystal semiconductor layer 124 is irradiated is higher than or equal to 72% and lower than or equal to 98%, preferably higher than or equal to 85% and lower than or equal to 96%. Thus, a condition of the energy density of the laser light for the irradiation is specified, whereby the single crystal semiconductor layer 124 provided over the base substrate 120 with the insulating layer 102 therebetween can be sufficiently planarized.

As for an atmosphere in which the irradiation with the laser light is performed, the oxygen concentration in a chamber where the irradiation with the laser light is performed is made as low as possible so that oxygen can be prevented from being taken into the single crystal semiconductor layer 124 in the planarization step. When oxygen in the atmosphere is taken into the single crystal semiconductor layer 124, an oxide film is formed on the surface of the single crystal semiconductor layer 124. When a region of the single crystal semiconductor layer 124 where the oxide film is formed on the surface is irradiated with laser light, the planarity of the surface of the single crystal semiconductor layer 124 is significantly impaired. Therefore, in the case where a predetermined region in the single crystal semiconductor layer 124 is irradiated plural times with laser light in the planarization step, the oxygen concentration in the chamber is preferably made as low as possible so that oxygen is prevented from being taken into the single crystal semiconductor layer 124, in order to perform planarization sufficiently. As a specific method for lowering the oxygen concentration in the chamber, the atmosphere in the chamber may be set to a vacuum atmosphere, a reducing atmosphere, or an inert atmosphere (e.g., a nitrogen atmosphere). The oxygen concentration in the vacuum atmosphere, the reducing atmosphere, or the inert atmosphere is preferably lower than 100 ppm, more preferably lower than 1 ppm.

In addition, when oxygen in the atmosphere is taken into the single crystal semiconductor layer 124, characteristics of an element (e.g., a transistor) in which the single crystal semiconductor layer 124 is used may be adversely affected. In order to prevent such an adverse affect, it is preferable that the atmosphere in the chamber where the irradiation with the laser light is performed be set to a reducing atmosphere (e.g., a hydrogen atmosphere) or an inert atmosphere, and that the oxygen concentration in the reducing atmosphere or the inert atmosphere be lower than 1 ppb, more preferably lower than 1 ppt.

Heat treatment is preferably performed after the planarization step as needed. Defects in the single crystal semiconductor layer 124 or defects at an interface between the single crystal semiconductor layer 124 and the insulating layer 102 can be repaired by the heat treatment.

Specifically, although the single crystal semiconductor layer 124 after being irradiated with the laser light 130 contains many defects in a region which is not melted, crystal defects or the like in the single crystal semiconductor layer 124 can be repaired effectively by performing the heat treatment at high temperature. In this embodiment, heating temperature of the single crystal semiconductor layer 124 is set to be a temperature higher than the temperature of heat treatment in a later step, preferably 640° C. or higher (more preferably 700° C. or higher) and be a temperature at which the single crystal semiconductor layer 124 is not completely melted and which is lower than the strain point of the base substrate 120. For example, in the case where a glass substrate is used as the base substrate 120, the heat treatment is preferably performed at a temperature higher than or equal to 640° C. and lower than or equal to 750° C. As specific examples of a heating unit used in the heat treatment, a heating furnace such as a resistance heating furnace and a rapid thermal annealing (RTA) apparatus can be given.

Further, after irradiating the single crystal semiconductor layer 124 with the laser light 130, the single crystal semiconductor layer 124 may be etched to be thinned. Since a state of the surface of the single crystal semiconductor layer 124 after the etching depends on a state of the surface of the single crystal semiconductor layer 124 before the etching, the surface of the single crystal semiconductor layer 124 is planarized by irradiation with the laser light 130 before the etching so that the single crystal semiconductor layer 124 having planarity can be obtained after the thinning.

A dry etching method or a wet etching method can be used for the etching in the thinning process as described above. Examples of etching gases that may be used in the case of a dry etching method are as follows: chloride gases such as boron chloride, silicon chloride, or carbon tetrachloride; a chlorine gas; fluoride gases such as sulfur fluoride and nitrogen fluoride; an oxygen gas; or the like. When a wet etching method is used, a TMAH aqueous solution may be used as an etchant.

In the case where the single crystal semiconductor layer 124 is thinned, the thickness of the thinned single crystal semiconductor layer 124 can be determined as appropriate in accordance with the characteristics of an element formed later using the single crystal semiconductor layer 124. For example, the thickness of the single crystal semiconductor layer 124 after the thinning may be greater than or equal to 5 nm and less than or equal to 200 nm, preferably greater than or equal to 10 nm and less than or equal to 70 nm.

In the case where the single crystal semiconductor layer 124 is thinned, the thinning is preferably performed before the heat treatment, after the planarization step. The heat treatment which is performed after the thinning treatment repairs the surface of the single crystal semiconductor layer 124 which is damaged by etching in the thinning treatment.

As described above, in this embodiment, ion doping is used in the step of forming the embrittled region 104 and the temperature of the single crystal semiconductor substrate 100 is set to 250° C. or higher at the time of the ion doping, whereby a defect in transferring of part of the semiconductor thin film can be prevented and unevenness on the surface of the single crystal semiconductor layer 124 can be reduced when a step is performed in which the single crystal semiconductor substrate 100 and the base substrate 120 are separated (transferring process). Accordingly, the yield of the SOI substrate can be improved.

Embodiment 2

In this embodiment, a method for manufacturing an SOI substrate which is partly different from the method for manufacturing an SOI substrate described in Embodiment 1 will be described. Specifically, a method for bonding the single crystal semiconductor substrate 100 to the base substrate 120 will be described.

Figures 1, 3A:
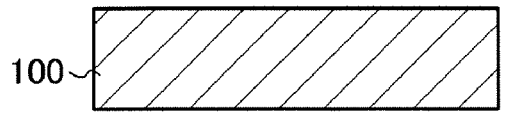

First, the single crystal semiconductor substrate 100 is prepared (see FIG. 3A-1).

Next, the insulating layer 102 is formed on the surface of the single crystal semiconductor substrate 100 (see FIG.

3A-2). The material and the forming method of the insulating layer 102 may be similar to those of the insulating layer 102 described in Embodiment 1. In this embodiment, the insulating layer 102 (here, a $SiO_x$ film) is formed by performing thermal oxidation treatment on the single crystal semiconductor substrate 100.

Next, the single crystal semiconductor substrate 100 is irradiated with ions having kinetic energy through the insulating layer 102 to form the embrittled region 104 having a damaged crystal structure at a predetermined depth in the single crystal semiconductor substrate 100 (see FIG. 3A-3). As a method for forming the embrittled region 104, the method described in Embodiment 1 can be used. In this embodiment, ions are added to the single crystal semiconductor substrate 100 by an ion doping method using an ion doping apparatus. The temperature of the single crystal semiconductor substrate 100 is set to 250° C. or higher at the time of the ion doping.

Figures 1, 3B:
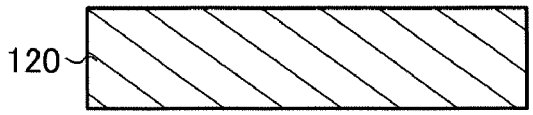
Figures 2, 3A:
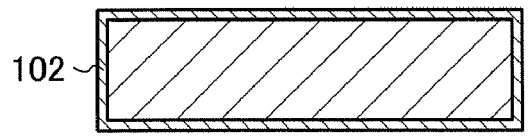
Figures 2, 3B:
Figures 3, 3A:
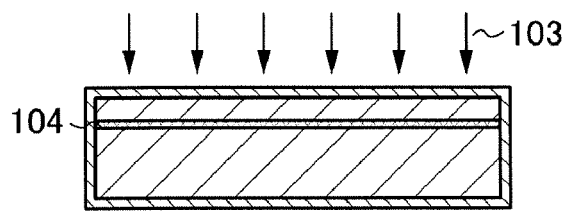

Next, the base substrate 120 is prepared (see FIG. 3B-1).

Next, an insulating layer 121 (for example, an insulating film containing nitrogen such as a silicon nitride film or a silicon nitride oxide film) is formed on the surface of the base substrate 120 (see FIG. 3B-2). In this embodiment, the insulating layer 121 serves as a layer (bonding layer) which is to be bonded to the insulating layer 102 provided over the single crystal semiconductor substrate 100. In addition, in the case where a glass substrate is used as the base substrate, when a single crystal semiconductor layer including a single crystal structure is formed over the base substrate later, the insulating layer 121 functions as a barrier layer for preventing impurities such as Na (sodium) contained in the base substrate from diffusing into the single crystal semiconductor layer.

Since the insulating layer 121 is to be a bonding layer, a surface of the insulating layer 121 is preferably made smooth in order to avoid defective bonding. Specifically, the insulating layer 121 is preferably formed to have an average surface roughness (Ra) of 0.5 nm or less and a root-mean-square roughness (Rms) of 0.60 nm or less, more preferably, an average surface roughness of 0.35 nm or less and a root-mean-square roughness of 0.45 nm or less. In order to make the surface of the insulating layer 121 smooth, for example, the insulating layer 121 is preferably formed using a plasma CVD apparatus in which plasma is generated by applying a pulse-modulated electric power (high-frequency electric power); however, the insulating layer 121 may be formed using a different CVD method, a sputtering method, or the like, without being limited to the above method. The thickness of the insulating layer 121 is preferably in the range of greater than or equal to 10 nm and less than or equal to 200 nm, more preferably, greater than or equal to 50 nm and less than or equal to 100 nm.

Figure 3C:
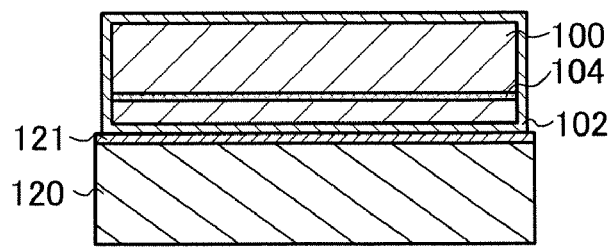

Next, the surface of the single crystal semiconductor substrate 100 and the surface of the base substrate 120 are made to face each other, and the surface of the insulating layer 102 and the surface of the insulating layer 121 are bonded to each other (see FIG. 3C).

In this embodiment, the single crystal semiconductor substrate 100 and the base substrate 120 are disposed in close contact with each other with the insulating layer 102 and the insulating layer 121 therebetween, and then a pressure of 30 Pa to $5 \times 10^6$ Pa, preferably $1 \times 10^2$ Pa to $1 \times 10^6$ Pa, more preferably $5 \times 10^2$ Pa to $5 \times 10^4$ Pa is applied to a portion of the single crystal semiconductor substrate 100. Bonding between the insulating layer 102 and the insulating layer 121 begins at the pressed portion and then spontaneous bonding proceeds throughout the surface. This bonding step is performed by the action of Van der Waals force or hydrogen bonding and can be performed at room temperature without heat treatment. Therefore, a substrate with low heat resistance temperature, such as a glass substrate, can be used as the base substrate 120.

Note that before the single crystal semiconductor substrate 100 is attached to the base substrate 120, surface treatment is preferably performed on each of the insulating layer 102 formed over the single crystal semiconductor substrate 100 and the insulating layer 121 formed over the base substrate 120.

As the surface treatment, plasma treatment, ozone treatment, megasonic cleaning, or two-fluid cleaning (a method for spraying functional water such as pure water or hydrogen-containing water with a carrier gas such as nitrogen), or a combination thereof can be performed as appropriate. In particular, ozone treatment, megasonic cleaning, or two-fluid cleaning is performed after the surface of at least one of the insulating layer 102 and the insulating layer 121 is subjected to plasma treatment, whereby dust such as an organic substance on the surface of the insulating layer 102 and/or the surface of the insulating layer 121 can be removed and the surface can be made hydrophilic. As a result, bonding strength between the insulating layer 102 and the insulating layer 121 can be improved.

Further, it is preferable to perform heat treatment to increase the bonding strength after the insulating layer 102 and the insulating layer 121 are bonded. The temperature of the heat treatment is a temperature such that a crack is not generated in the embrittled region 104. For example, the heat treatment is performed at a temperature in the range of higher than or equal to 20° C. and lower than or equal to 500° C., preferably higher than or equal to 50° C. and lower than or equal to 480° C., more preferably higher than or equal to 60° C. and lower than or equal to 300° C. Alternatively, the insulating layer 102 and the insulating layer 121 may be bonded together while being heated at a temperature in this temperature range. As a heating unit for the heat treatment, a heating furnace such as a resistance heating furnace, a rapid thermal annealing (RTA) apparatus, a microwave heating apparatus, or the like can be used.

In general, when heat treatment is performed at the same time as or after the insulating layer 102 and the insulating layer 121 are bonded together, dehydration reaction proceeds at bonding interfaces. Then the bonding interfaces come closer to each other and therefore, hydrogen bonding is strengthened and a covalent bond is formed, whereby the bonding is strengthened. In order to promote the dehydration reaction, moisture generated at the bonding interface through the dehydration reaction should be removed by heat treatment at high temperature. In other words, when heat treatment after bonding is performed at low temperature, moisture generated at the bonding interface through the dehydration reaction cannot be removed effectively; thus, the dehydration reaction does not proceed and bonding strength cannot be improved sufficiently.

On the other hand, when an oxide film containing chlorine atoms and the like is used as the insulating layer 102, moisture can be absorbed and diffused into the insulating layer 102; thus, moisture generated by the dehydration reaction at a bonding interface can be absorbed and diffused into the insulating layer 102 and the dehydration reaction can be promoted efficiently even when heat treatment after bonding is performed at low temperature. In this case, even when a substrate having low heat resistance such as a glass substrate is used as the base substrate 120, the bonding strength between the insulating layer 102 and the insulating layer 121 can be sufficiently improved. Further, by performing plasma treatment by applying a bias voltage, a micropore is formed in the vicinity of the surface of the insulating layer 102 and moisture is effectively absorbed and diffused, and the bonding strength between the insulating layer 102 and the insulating layer 121 can be improved even when heat treatment is performed at low temperature.

Figure 3D:
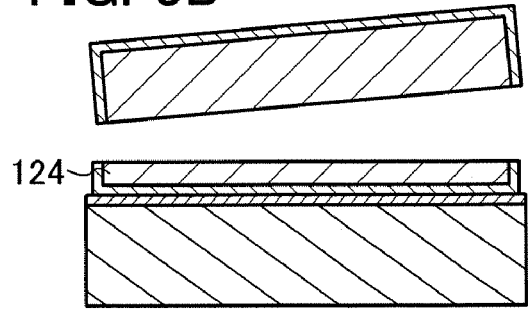

Next, the single crystal semiconductor layer 124 is provided over the base substrate 120 with the insulating layer 121 and the insulating layer 102 therebetween by separation along the embrittled region 104 using heat treatment (see FIG. 3D). Since a specific method and the like of the heat treatment can be similar to those of the heat treatment in FIG. 1D described in Embodiment 1, detailed description thereof is omitted here.

Note that, by performing only the heat treatment in FIG. 3D without performing the above-described heat treatment for increasing the bonding strength between the insulating layer 102 and the insulating layer 121, the heat treatment step for increasing the bonding strength between the insulating layer 102 and the insulating layer 121 and the heat treatment step for causing separation along the embrittled region 104 may be performed at the same time.

After the above steps, the step for planarizing the surface of the single crystal semiconductor layer 124 and the like described in Embodiment 1 are performed as appropriate, so that an SOI substrate in which the single crystal semiconductor layer 124 is provided over the base substrate 120 with the insulating layer 121 and the insulating layer 102 therebetween can be manufactured.

In this embodiment, the embrittled region 104 is formed using the above method, whereby a defect in transferring of part of the semiconductor thin film can be prevented from being caused in the separation step. Further, in addition to preventing a defect in transferring of part of the semiconductor thin film from being caused in the separation step, unevenness on the surface of the single crystal semiconductor layer 124 immediately after the separation step can be reduced.

With the bonding method described in this embodiment, even in the case where the insulating layer 121 is used as the bonding layer, the bonding strength between the base substrate 120 and the single crystal semiconductor layer 124 can be improved and reliability can be improved. Even in the case where a glass substrate is used as the base substrate 120, an SOI substrate in which diffusion of impurities into the single crystal semiconductor layer 124 formed over the base substrate 120 can be suppressed and at the same time the base substrate 120 and the single crystal semiconductor layer 124 are firmly attached can be formed.

In addition, by forming an insulating film containing nitrogen on the base substrate side and forming an oxide film containing halogen such as chlorine on the semiconductor substrate side, impurity elements can be prevented from entering the semiconductor substrate before bonding the semiconductor substrate and the base substrate to each other. Further, by forming the oxide film containing halogen such as chlorine as a bonding layer which is provided on the semiconductor substrate side, dehydrogenation reaction is promoted efficiently and bonding strength can be improved, even when heat treatment after bonding is performed at low temperature.

Note that the separated single crystal semiconductor substrate 100 can be reused by conducting a regeneration treatment in a process of manufacturing an SOI substrate. As an example of the regeneration treatment, a method in which laser light is irradiated to the single crystal semiconductor substrate from the side from which the single crystal semiconductor layer has been separated.

In this embodiment, the case where the insulating layer 102 is formed over the single crystal semiconductor substrate 100 and the insulating layer 121 is formed over the base substrate 120 is described; however, the present invention is not limited to this structure. For example, the insulating layer 102 and the insulating layer 121 (for example, insulating films containing nitrogen) may be stacked in this order over the single crystal semiconductor substrate 100, and the surface of the insulating layer 121 over the insulating layer 102 and the surface of the base substrate 120 may be bonded together. In this case, the insulating layer 121 may be provided either before or after the formation of the embrittled region 104. An oxide film (for example, a silicon oxide film) may be formed over the insulating layer 121 over the insulating layer 102 and a surface of the oxide film and the surface of the base substrate 120 may be bonded together.

In the case where entry of an impurity into the single crystal semiconductor layer 124 from the base substrate 120 does not cause so much problems, or the like, the insulating layer 121 does not need to be provided over the base substrate 120, and the surface of the insulating layer 102 provided over the single crystal semiconductor substrate 100 can be directly bonded to the surface of the base substrate 120. In such a case, a step for forming the insulating layer 121 can be omitted, whereby manufacturing cost can be reduced owing to reduction in the number of processes.

Embodiment 3

In this embodiment, an example of a method for manufacturing a semiconductor device using an SOI substrate will be described. Specifically, an example of a method for manufacturing an n-channel TFT and a p-channel TFT as a semiconductor device will be described.

Figure 4A:
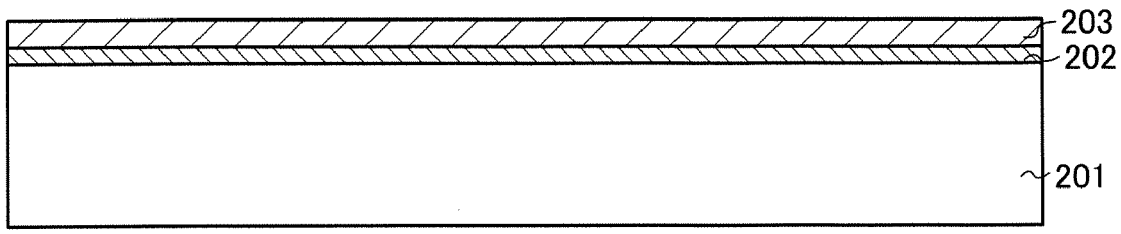
FIGS. 4A to 4D are cross-sectional views illustrating an example of a method for manufacturing an SOI substrate.

FIG. 4A is a cross-sectional view of an SOI substrate in which a single crystal semiconductor layer 203 is provided over a base substrate 201 with an insulating layer 202 therebetween.

Figure 4B:
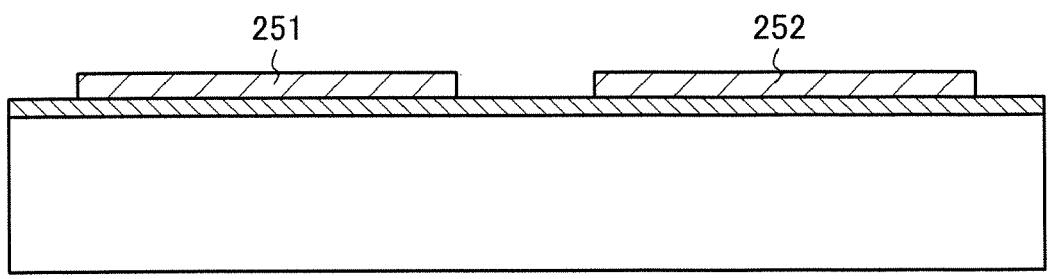

First, the single crystal semiconductor layer 203 is separated into elements by etching to form semiconductor layers 251 and 252 as illustrated in FIG. 4B.

Figure 4C:
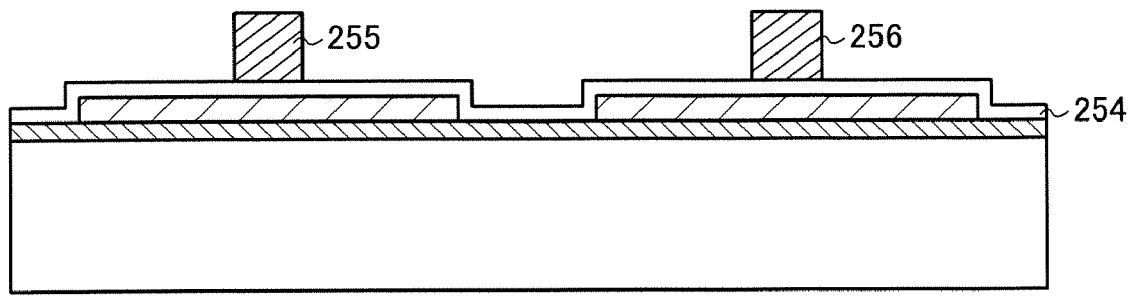

Next, as illustrated in FIG. 4C, an insulating film 254 is formed over the semiconductor layers 251 and 252. Next, a gate electrode 255 is formed over the semiconductor layer 251 with the insulating film 254 therebetween, and a gate electrode 256 is formed over the semiconductor layer 252 with the insulating film 254 therebetween. Here, the insulating film 254 functions as a gate insulating film.

Before the single crystal semiconductor layer 203 is etched, an impurity element imparting p-type conductivity such as boron, aluminum, or gallium or an impurity element imparting n-type conductivity such as phosphorus or arsenic is preferably added to the single crystal semiconductor layer 203 in order to control the threshold voltage of the TFTs. For example, an impurity element imparting p-type conductivity is added to a formation region of an n-channel TFT, and an impurity element imparting n-type conductivity is added to a formation region of a p-channel TFT.

Figure 4D:
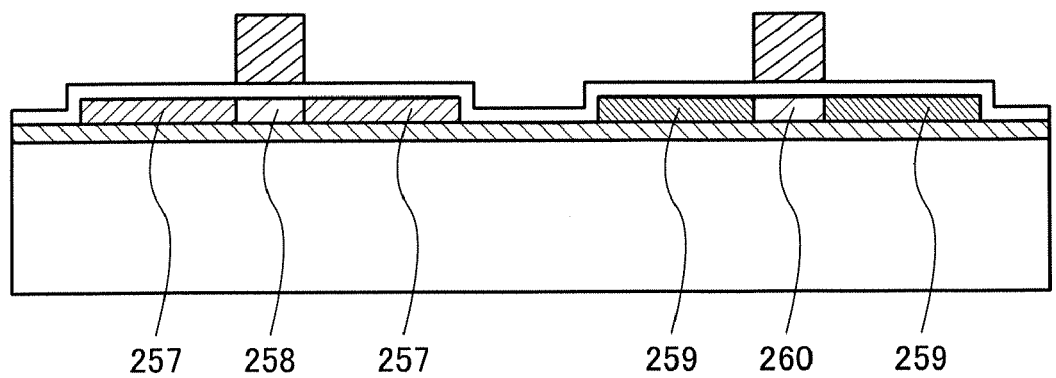

Next, as illustrated in FIG. 4D, n-type low-concentration impurity regions 257 are formed in the semiconductor layer 251, and p-type high-concentration impurity regions 259 are formed in the semiconductor layer 252.

Specifically, the semiconductor layer 252 where a p-channel TFT is to be formed is covered with a resist mask. Then, an impurity element imparting n-type conductivity is added to the semiconductor layer 251 by an ion doping method or an ion implantation method with use of the gate electrode 255 as a mask, so that the n-type low-concentration impurity regions 257 are formed in a self-aligned manner. A region of the semiconductor layer 251, which overlaps with the gate electrode 255, serves as a channel formation region 258.

Next, after the mask which covers the semiconductor layer 252 is removed, the semiconductor layer 251 where an n-channel TFT is to be formed is covered with a resist mask. Then, an impurity element imparting p-type conductivity is added to the semiconductor layer 252 by an ion doping method or an ion implantation method with use of the gate electrode 256 as a mask, so that the p-type high-concentration impurity regions 259 are formed in a self-aligned manner. Here, the p-type high-concentration impurity regions 259 serve as a source region and a drain region. A region of the semiconductor layer 252 which overlaps with the gate electrode 256 serves as a channel formation region 260.

Here, the method in which the p-type high-concentration impurity regions 259 are formed after the n-type low-concentration impurity regions 257 are formed is described; however, the n-type low-concentration impurity regions 257 can be formed after the p-type high-concentration impurity regions 259 are formed.

Next, after the resist mask that covers the semiconductor layer 251 is removed, an insulating film having a single-layer structure or a stacked-layer structure, which is formed using a nitrogen compound such as silicon nitride or an oxide such as silicon oxide, is formed by a plasma CVD method or the like.

Figure 5A:
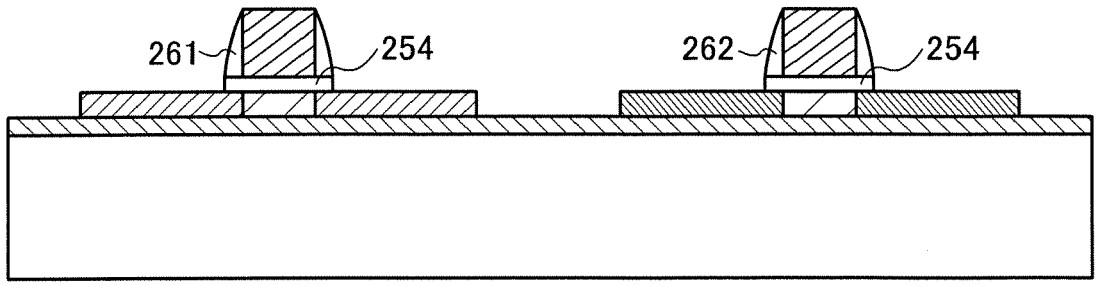
FIGS. 5A to 5C are cross-sectional views illustrating an example of a method of manufacturing an SOI substrate.

This insulating film is anisotropically etched in a direction substantially perpendicular to a surface of the SOI substrate, whereby sidewall insulating films 261 and 262 are formed in contact with side surfaces of the gate electrodes 255 and 256 respectively, as illustrated in FIG. 5A. By this anisotropic etching, the insulating film 254 is also etched.

Figure 5B:
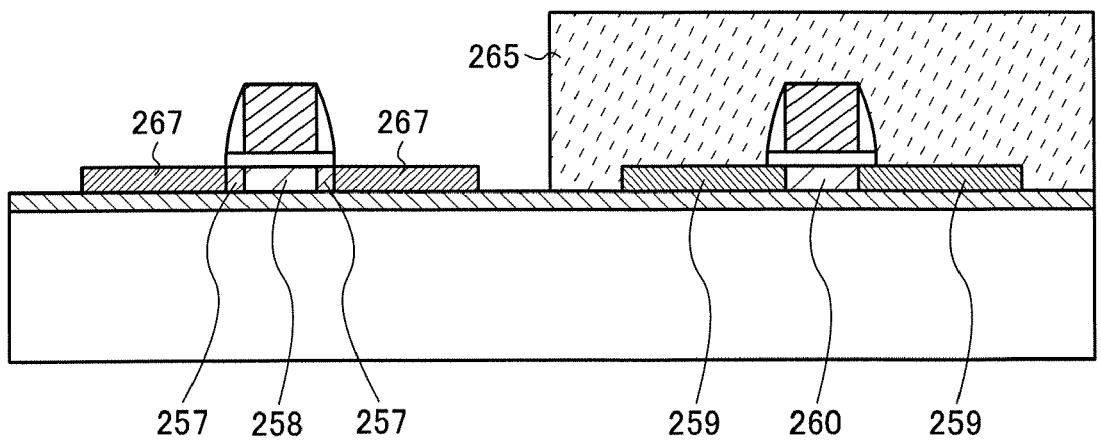

Next, as illustrated in FIG. 5B, the semiconductor layer 252 is covered with a resist 265. Then, an impurity element imparting n-type conductivity is added to the semiconductor layer 251 by an ion doping method or an ion implantation method with use of the gate electrode 255 and the sidewall insulating films 261 as masks, so that n-type high-concentration impurity regions 267 are formed in a self-aligned manner. Here, the n-type high-concentration impurity regions 267 serve as a source region and a drain region.

Next, heat treatment for activating the impurity elements is performed. Through the above steps, a semiconductor device including an n-channel TFT and a p-channel TFT can be manufactured; however, the following steps are preferably added as needed.

Figure 5C:
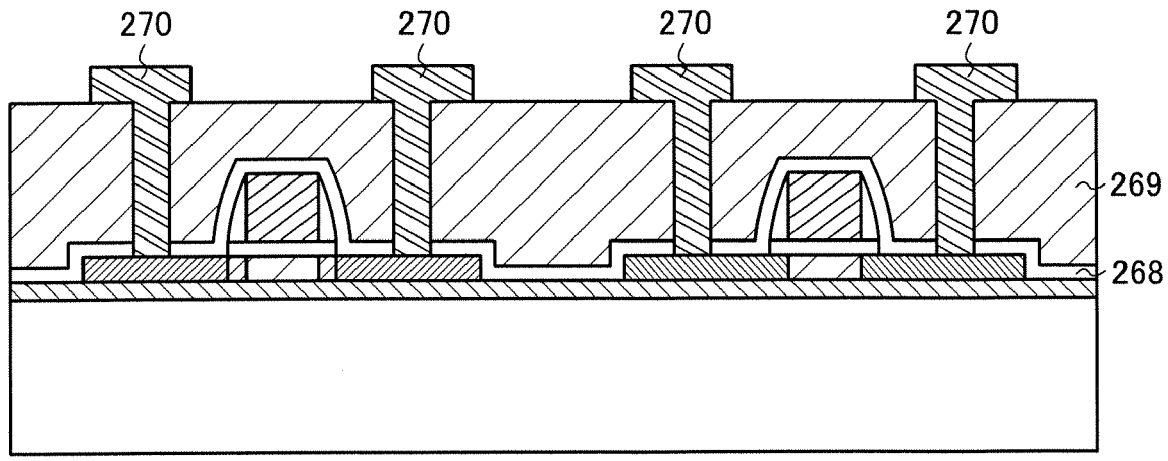

After the heat treatment, an insulating film 268 containing hydrogen is formed as illustrated in FIG. 5C. After the insulating film 268 is formed, heat treatment is performed at a temperature of higher than or equal to 350° C. and lower than or equal to 450° C. so that hydrogen contained in the insulating film 268 diffuses into the semiconductor layers 251 and 252. The insulating film 268 can be formed, for example, by deposition of silicon nitride or silicon nitride oxide by a plasma CVD method at a process temperature of 350° C. or lower. The supply of hydrogen to the semiconductor layers 251 and 252 makes it possible to effectively repair defects that might serve as trapping centers in the semiconductor layers 251 and 252, at an interface between the semiconductor layer 251 and the insulating film 254, and at an interface between the semiconductor layer 252 and the insulating film 254.

Next, an interlayer insulating film 269 is formed so as to cover the insulating film 268. As a material of the interlayer insulating film 269, for example, an insulating film containing an inorganic material, such as a silicon oxide film or a borophosphosilicate glass (BPSG) film, or an organic resin film containing polyimide, acrylic, or the like can be used. The interlayer insulating film 269 may have a single-layer structure or a stacked-layer structure.

After contact holes are formed in the interlayer insulating film 269, wirings 270 are formed. The wirings 270 are electrically connected to the source regions and the drain regions. The wirings 270 can be formed, for example, using a conductive film with a three-layer structure in which a low-resistance metal film such as an aluminum film or an aluminum alloy film is interposed between barrier metal films. For the barrier metal films, molybdenum, chromium, titanium, or the like can be used.

Although this embodiment describes the method for manufacturing a TFT as an example of a semiconductor device, a semiconductor device can be manufactured so as to have high added value by forming semiconductor elements such as a capacitor and a resistor together with the TFT.

Embodiment 4

Figure 6:
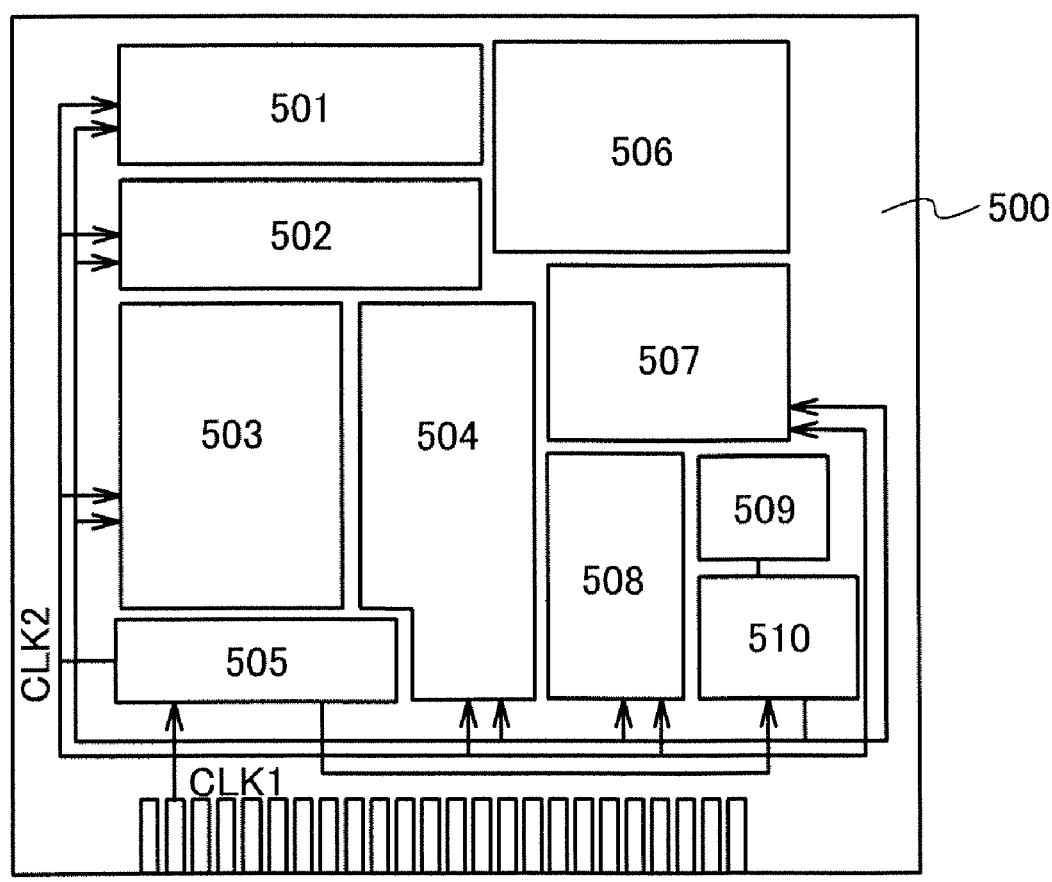
FIG. 6 is a block diagram illustrating an example of a semiconductor device in which an SOI substrate is used.

In this embodiment, as an example of a semiconductor device, a microprocessor will be described. FIG. 6 is a block diagram illustrating a structural example of a microprocessor 500.

The microprocessor 500 includes an arithmetic logic unit (also referred to as an ALU) 501, an ALU controller 502, an instruction decoder 503, an interrupt controller 504, a timing controller 505, a register 506, a register controller 507, a bus interface (Bus I/F) 508, a read-only memory (ROM) 509, and a memory interface (ROM I/F) 510.

An instruction input to the microprocessor 500 through the bus interface 508 is input to the instruction decoder 503 and decoded. Then, the instruction is input to the ALU controller 502, the interrupt controller 504, the register controller 507, and the timing controller 505. The ALU controller 502, the interrupt controller 504, the register controller 507, and the timing controller 505 conduct various controls based on the decoded instruction.

The ALU controller 502 generates signals for controlling the operation of the ALU 501. The interrupt controller 504 is a circuit which processes an interrupt request from an external input/output device or a peripheral circuit while the microprocessor 500 is executing a program, and the interrupt controller 504 processes an interrupt request based on its priority or a mask state. The register controller 507 generates an address of the register 506, and reads and writes data from and to the register 506 in accordance with the state of the microprocessor 500. The timing controller 505 generates signals for controlling timing of operation of the ALU 501, the ALU controller 502, the instruction decoder 503, the interrupt controller 504, and the register controller 507. For example, the timing controller 505 is provided with an internal clock generator for generating an internal clock signal CLK2 based on a reference clock signal CLK1. As illustrated in FIG. 6, the internal clock signal CLK2 is input to other circuits.

Figure 7:
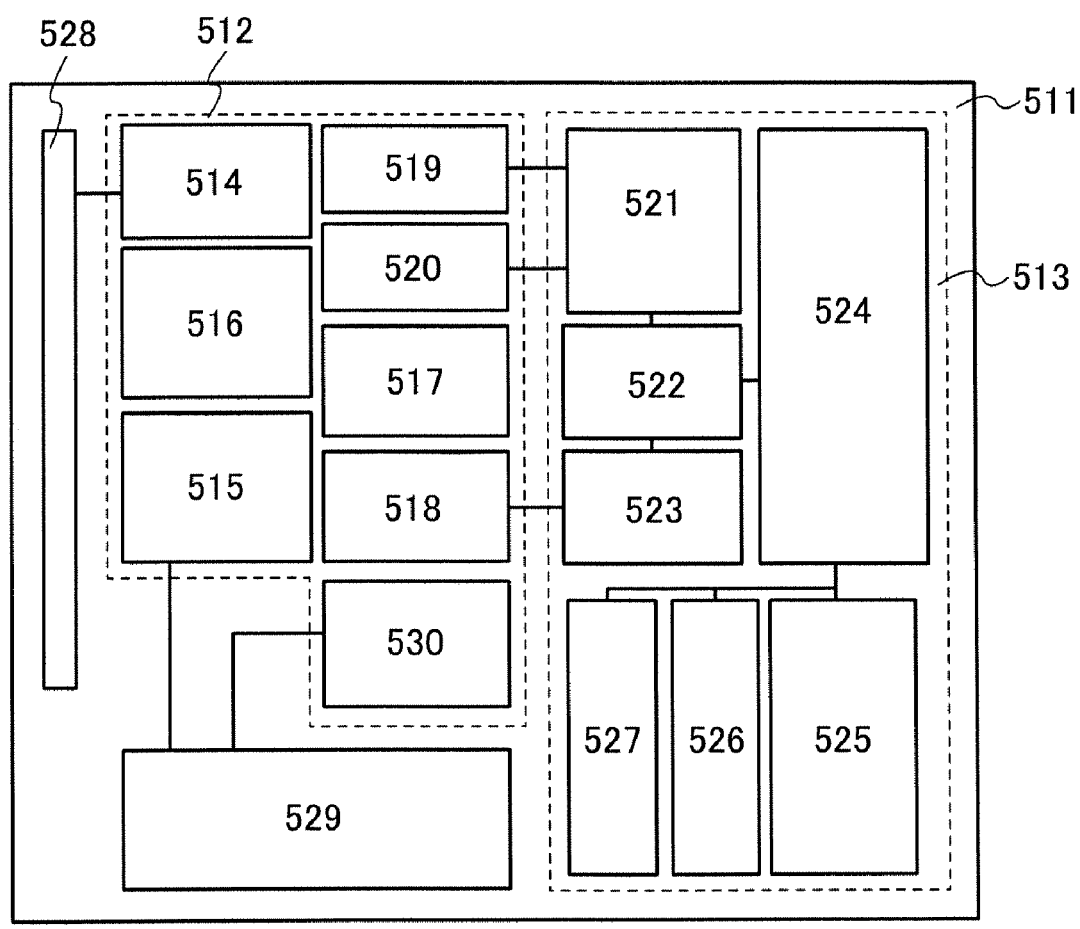
FIG. 7 is a block diagram illustrating an example of a semiconductor device in which an SOI substrate is used.

Next, an example of a semiconductor device having a function of transmitting and receiving data without contact and also having an arithmetic function will be described. FIG. 7 is a block diagram illustrating a structural example of such a semiconductor device. The semiconductor device illustrated in FIG. 7 can be referred to as a computer which operates by transmitting and receiving signals to and from an external device by wireless communication (hereinafter, referred to as an "RFCPU").

As illustrated in FIG. 7, an RFCPU 511 includes an analog circuit portion 512 and a digital circuit portion 513. The analog circuit portion 512 includes a resonant circuit 514 having a resonant capacitor, a rectifier circuit 515, a constant voltage circuit 516, a reset circuit 517, an oscillator circuit 518, a demodulation circuit 519, a modulation circuit 520 and a power supply control circuit 530. The digital circuit portion 513 includes an RF interface 521, a control register 522, a clock controller 523, an interface (CPU interface) 524, a central processing unit (CPU) 525, a random access memory (RAM) 526, and a read only memory (ROM) 527.

The operation of the RFCPU 511 is roughly described below. The resonance circuit 514 generates an induced electromotive force based on a signal received by an antenna 528. The induced electromotive force is stored in a capacitor portion 529 through the rectifier circuit 515. This capacitor portion 529 is preferably formed using a capacitor such as a ceramic capacitor or an electric double-layer capacitor. The capacitor portion 529 does not need to be integrated on a substrate which is included in the RFCPU 511 and the capacitor portion 529 can be incorporated into the RFCPU 511 as a different component.

The reset circuit 517 generates a signal for resetting and initializing the digital circuit portion 513. For example, a signal that rises with delay after rise in power supply voltage is generated as a reset signal. The oscillator circuit 518 changes the frequency and duty ratio of a clock signal in response to a control signal generated by the constant voltage circuit 516. The demodulation circuit 519 is a circuit which demodulates a received signal, and the modulation circuit 520 is a circuit which modulates data that is to be transmitted.

For example, the demodulation circuit 519 is formed using a low pass filter and binarizes a received signal of an amplitude shift keying (ASK) system based on variation of its amplitude. The modulation circuit 520 transmits transmission data by changing the amplitude of a transmission signal of an amplitude shift keying (ASK) system. The modulation circuit 520 changes the resonance point of the resonance circuit 514, thereby changing the amplitude of a communication signal.

The clock controller 523 generates a control signal for changing the frequency and duty ratio of a clock signal in accordance with the power supply voltage or a consumption current of the central processing unit 525. The power supply voltage is monitored by the power supply control circuit 530.

A signal that is input to the RFCPU 511 from the antenna 528 is demodulated by the demodulation circuit 519, and then divided into a control command, data, and the like by the RF interface 521. The control command is stored in the control register 522. The control command includes reading of data stored in the read-only memory 527, writing of data into the random-access memory 526, an arithmetic instruction to the central processing unit 525, and the like.

The central processing unit 525 accesses the read-only memory 527, the random-access memory 526, and the control register 522 via the interface 524. The interface 524 has a function of generating an access signal for any of the read-only memory 527, the random-access memory 526, and the control register 522 based on an address requested by the central processing unit 525.

As an arithmetic method of the central processing unit 525, a method may be employed in which the read-only memory 527 stores an operating system (OS) and a program is read and executed at the time of starting operation. Alternatively, a method may be employed in which a circuit dedicated to arithmetic is formed and an arithmetic processing is conducted using hardware. In a method in which both hardware and software are used, part of arithmetic processing is conducted by a dedicated arithmetic circuit and the other part of the arithmetic processing is conducted by the central processing unit 525 using a program.

Embodiment 5

In this embodiment, an example of a method for manufacturing a display device using an SOI substrate will be described.

Figure 8A:
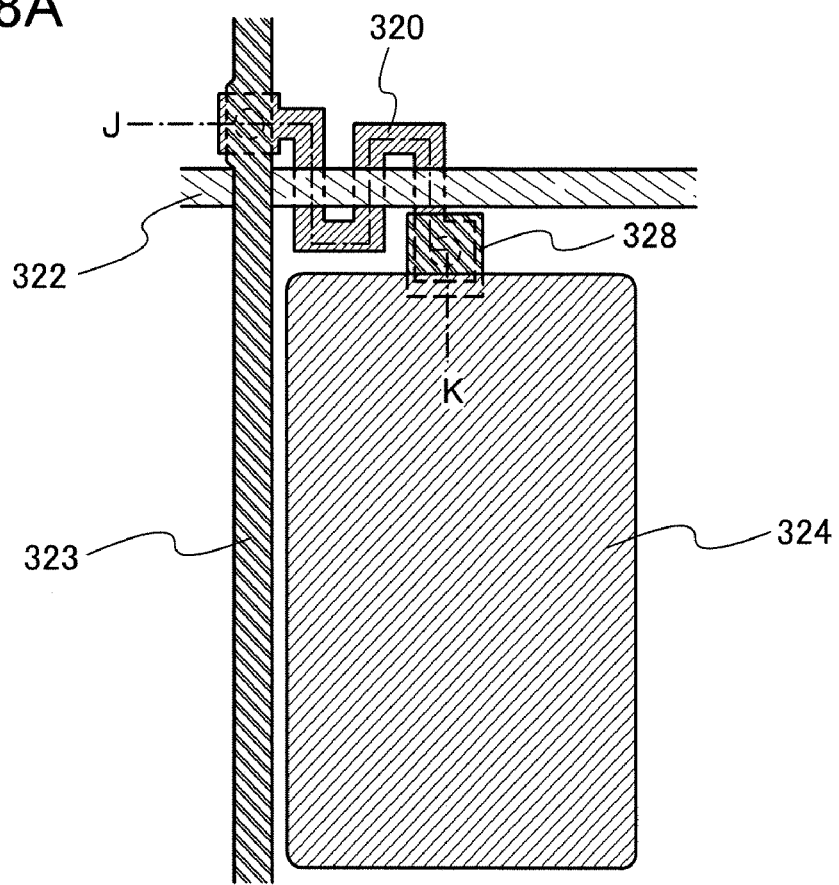
FIGS. 8A and 8B are a plan view and a cross-sectional view illustrating an example of a display device in which an SOI substrate is used.
Figure 8B:
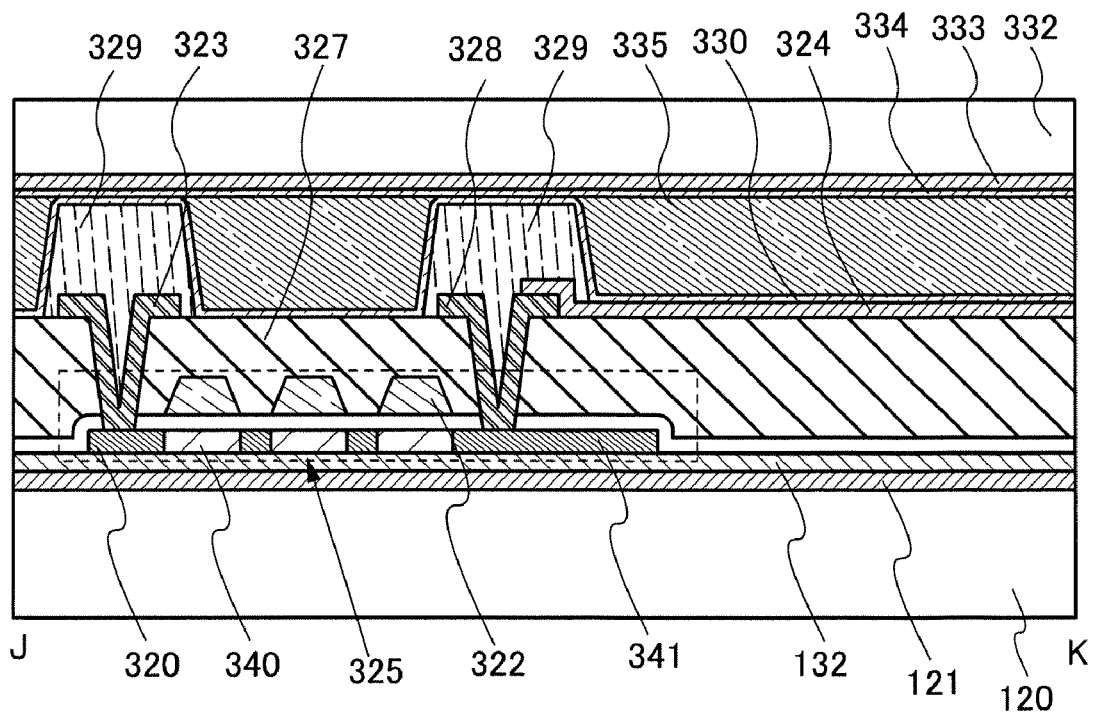

FIGS. 8A and 8B are drawings for describing a liquid crystal display device. FIG. 8A is a plan view of a pixel of the liquid crystal display device, and FIG. 8B is a cross-sectional view taken along a section line i-K in FIG. 8A.

As illustrated in FIG. 8A, the pixel includes a single crystal semiconductor layer 320, a scan line 322 intersecting with the single crystal semiconductor layer 320, a signal line 323 intersecting with the scan line 322, a pixel electrode 324, and an electrode 328 which electrically connects the pixel electrode 324 to the single crystal semiconductor layer 320. The single crystal semiconductor layer 320 is a layer formed of the single crystal semiconductor layer provided over the base substrate 120 and is included in a TFT 325 of the pixel.

As an SOI substrate, the SOI substrate described in any of the above embodiments is used. As illustrated in FIG. 8B, the single crystal semiconductor layer 320 is stacked over the base substrate 120 with an oxide film 132 and the insulating layer 121 therebetween. As the base substrate 120, a glass substrate can be used. The single crystal semiconductor layer 320 of the TFT 325 is formed by element isolation of the single crystal semiconductor layer of the SOI substrate by etching. In the single crystal semiconductor layer 320, channel formation regions 340 and n-type high-concentration impurity regions 341 to which an impurity element is added are formed. A gate electrode of the TFT 325 is included in the scan line 322 and one of a source electrode and a drain electrode of the TFT 325 is included in the signal line 323.

Over an interlayer insulating film 327, the signal line 323, the pixel electrode 324, and the electrode 328 are provided. Over the interlayer insulating film 327, columnar spacers 329 are formed. An alignment film 330 is formed to cover the signal line 323, the pixel electrode 324, the electrode 328, and the columnar spacers 329. A counter substrate 332 is provided with a counter electrode 333 and an alignment film 334 which covers the counter electrode. The columnar spacers 329 are formed to maintain a space between the base substrate 120 and the counter substrate 332. A liquid crystal layer 335 is formed in the space formed by the columnar spacers 329. The interlayer insulating film 327 has a step at the connection portion between the high-concentration impurity regions 341 and each of the signal line 323 and the electrode 328 due to formation of contact holes; therefore, orientation of liquid crystals in the liquid crystal layer 335 is easily disordered at this connection portion. Accordingly, the columnar spacers 329 are formed in these step portions to prevent orientation disorder of liquid crystal.

Figure 9A:
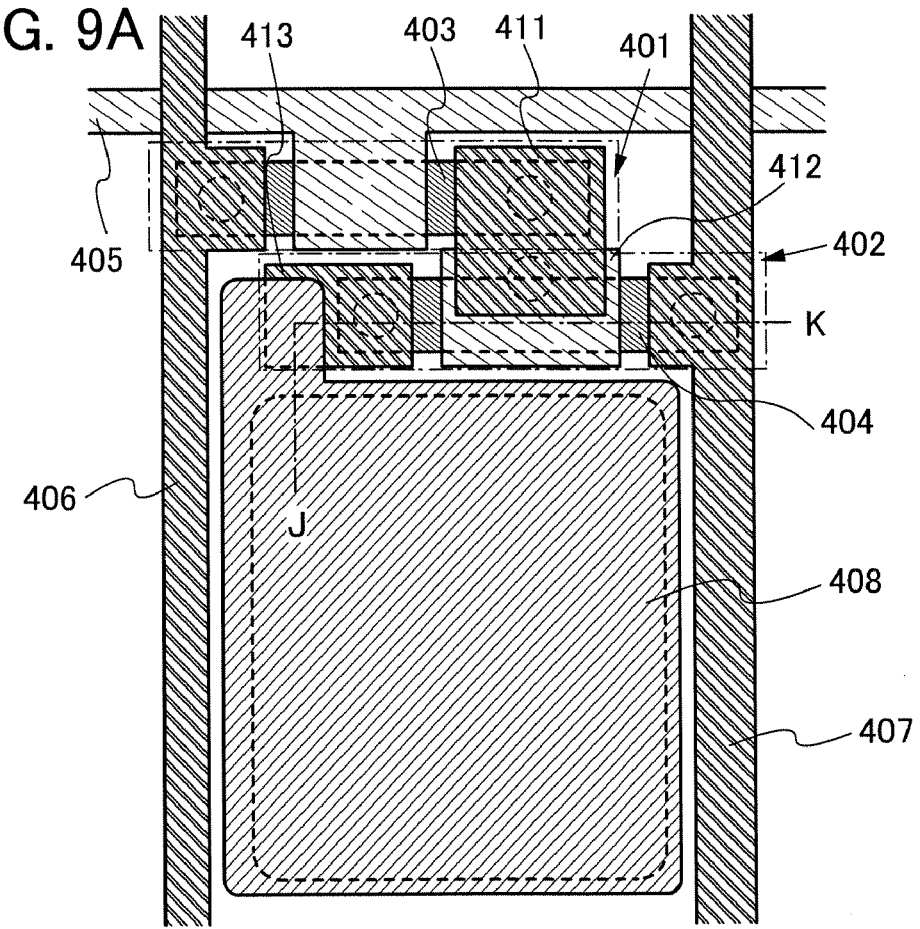
FIGS. 9A and 9B are a plan view and a cross-sectional view illustrating an example of a display device in which an SOI substrate is used.
Figure 9B:
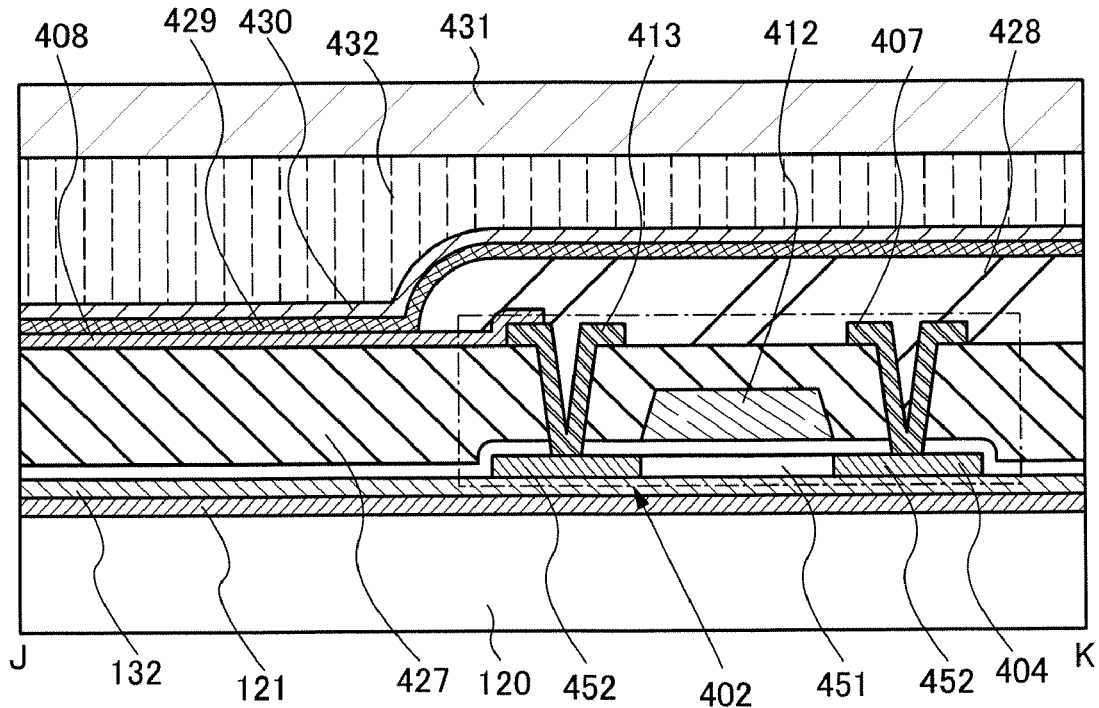

Next, an electroluminescent display device (hereinafter referred to as an "EL display device") is described with reference to FIGS. 9A and 9B. FIG. 9A is a plan view of a pixel of the EL display device, and FIG. 9B is a cross-sectional view taken along a section line i-K in FIG. 9A.

As illustrated in FIG. 9A, the pixel includes a selection transistor 401 and a display control transistor 402 each including a TFT, a scan line 405, a signal line 406, a current supply line 407, and a pixel electrode 408. Each pixel is provided with a light-emitting element having a structure in which a layer containing an electroluminescent material (EL layer) is interposed between a pair of electrodes. One electrode of the light-emitting element is the pixel electrode 408. In a semiconductor layer 403, a channel formation region, a source region, and a drain region of the selection transistor 401 are formed. In a semiconductor layer 404, a channel formation region, a source region, and a drain region of the display control transistor 402 are formed. The semiconductor layers 403 and 404 are formed of the single crystal semiconductor layer that is provided over the base substrate.

In the selection transistor 401, a gate electrode is included in the scan line 405, one of a source electrode and a drain electrode is included in the signal line 406, and the other thereof is formed as an electrode 410. In the display control transistor 402, a gate electrode 412 is electrically connected to an electrode 411; one of a source electrode and a drain electrode is formed as an electrode 413 that is electrically connected to the pixel electrode 408; and the other thereof is included in the current supply line 407.

The display control transistor 402 is a p-channel TFT. As illustrated in FIG. 9B, in the semiconductor layer 404, a channel formation region 451 and p-type high-concentration impurity regions 452 are formed. As the SOI substrate, the SOI substrate manufactured in any of the above embodiments is used.

An interlayer insulating film 427 is formed so as to cover the gate electrode 412 of the display control transistor 402. The signal line 406, the current supply line 407, the electrodes 411 and 413, and the like are formed over the interlayer insulating film 427. Moreover, the pixel electrode 408 which is electrically connected to the electrode 413 is formed over the interlayer insulating film 427. The pixel electrode 408 is surrounded by a partition wall layer 428, which has an insulating property, at the periphery. An EL layer 429 is formed over the pixel electrode 408, and a counter electrode 430 is formed over the EL layer 429. A counter substrate 431 is provided as a reinforcing plate, and the counter substrate 431 is fixed to the base substrate 120 with a resin layer 432.

The grayscale of the EL display device is controlled by a current drive method in which the luminance of the light-emitting element is controlled by the amount of current and a voltage drive method in which the luminance is controlled by the amount of voltage. The current drive method is difficult to be employed when transistors have characteristics which are largely different between pixels, and therefore a compensation circuit for compensating variation in characteristics is necessary. However, in the EL display device in this embodiment, the selection transistor 401 and the display control transistor 402 are formed using the SOI substrate described in any of the above embodiments, whereby variation in characteristics of the selection transistor 401 and the display control transistor 402 which are provided in each pixel is suppressed. Therefore, a current drive method can be positively employed.

Embodiment 6

In this embodiment, specific examples of an electronic device mounted with a semiconductor device manufactured using an SOI substrate will be described.

Examples of electronic devices are as follows: cameras such as video cameras and digital cameras; navigation systems; sound reproduction devices (such as car audio systems and audio components); computers; game machines; portable information terminals (such as mobile computers, mobile phones, portable game machines, and electronic book readers); image reproduction devices each having a function of reproducing data in a recording medium (specifically, display devices that are each capable of reproducing audio data stored in a recording medium such as a digital versatile disc (DVD) or a Blu-ray Disc and displaying image data stored therein); and the like. An example thereof is illustrated in FIGS. 10A to 10C.

Figure 10A:
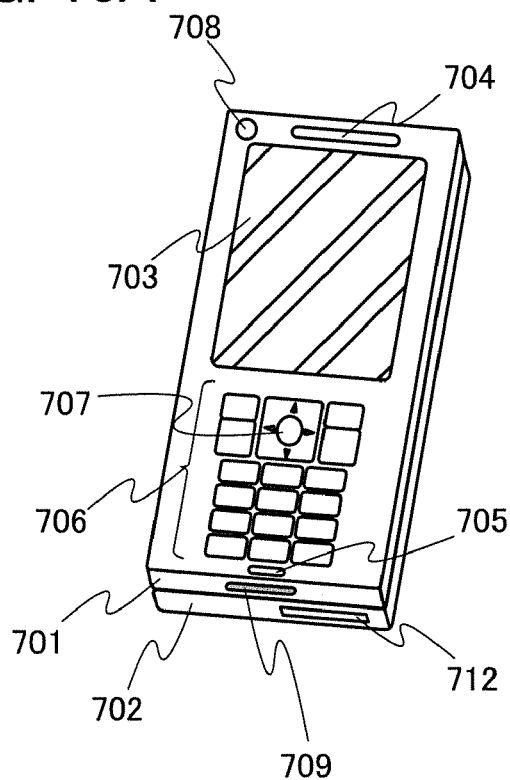
FIGS. 10A to 10C are external views illustrating an electronic device mounted with an SOI substrate.
Figure 10B:
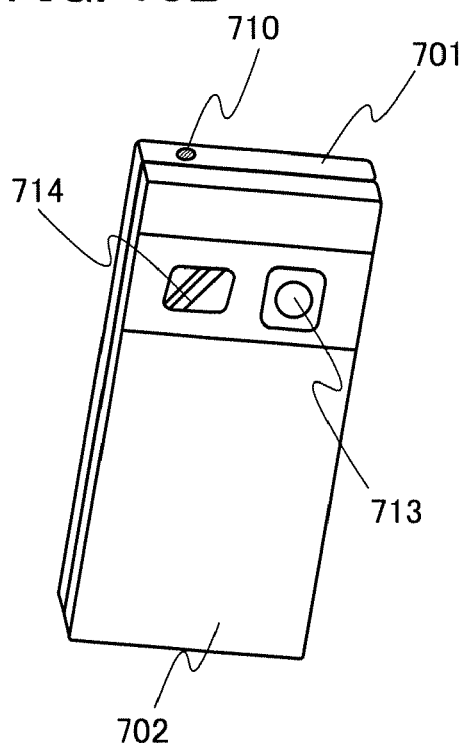
Figure 10C:
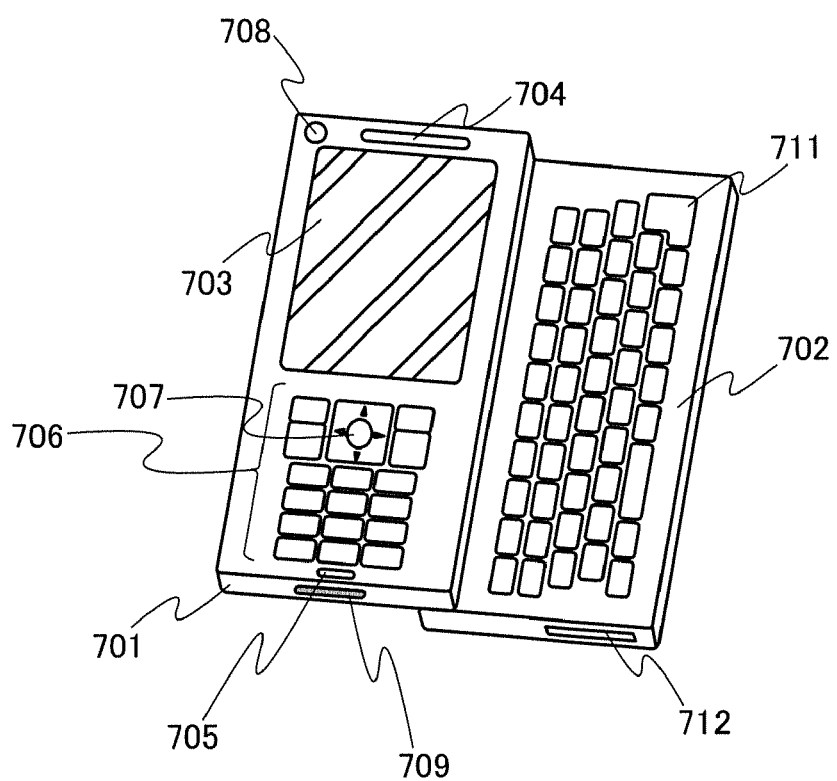

FIGS. 10A to 10C illustrate an example of a mobile phone to which the present invention is applied. FIG. 10A is a front view, FIG. 10B is a rear view, and FIG. 10C is a front view in which two housings are slid. A mobile phone 700 includes two housings 701 and 702. The mobile phone 700 has both functions of a mobile phone and a portable information terminal, and incorporates a computer. The mobile phone is a so-called smartphone, with which a variety of data processing is possible in addition to telephone conversation.

The mobile phone 700 includes the housing 701 and the housing 702. The housing 701 includes a display portion 703, a speaker 704, a microphone 705, operation keys 706, a pointing device 707, a front-face camera lens 708, an external connection terminal jack 709, an earphone terminal 710, and the like. The housing 702 includes a keyboard 711, an external memory slot 712, a rear-face camera 713, a light 714, and the like. In addition, an antenna is incorporated in the housing 701.

In addition to the above components, the mobile phone 700 may also be provided with a contactless IC chip, a small size memory device, an infrared communication function, a USB port, a television one-segment broadcasting receiving function, an earphone jack, or the like as appropriate.

The housings 701 and 702 which overlap with each other (illustrated in FIG. 10A) can be slid and are developed by being slid as illustrated in FIG. 10C. The display portion 703 can incorporate a display panel or a display device to which the method for manufacturing the display device described in Embodiment 5 is applied. Since the front-face camera lens 708 is provided in the same plane as the display portion 703, the mobile phone 700 can be used as a videophone. The housing 702 is provided with the rear-face camera 713 and the light 714 on its rear face (FIG. 10B), and still images and moving images can be taken by using the display portion 703 as a view finder.

Further, a function as a touch panel is preferably added to the display portion 703, in which case the mobile phone 700 can be operated by intuition by a user. Since the operation by intuition enables elderly people and children to handle the mobile phone 700 easily, the mobile phone 700 can be used by users of a wide range of ages. Note that such a structure in which a function as a touch panel is added to the display portion can be applied to any electronic device having a display portion, without being limited to a mobile phone. For example, it can be applied to a display portion of any of the electronic devices described above, such as cameras such as video cameras and digital cameras, navigation systems, audio reproduction devices, computers, game machines, portable information terminals, and image reproduction devices each having a function of reproducing data in a recording medium.

As an example of a method for adding a function as a touch panel to the display portion 703, a method can be given in which an element such as a photo sensor is provided in a region where a pixel is provided, in the liquid crystal display device or the EL display device described in the above embodiment.

The electronic device illustrated in FIGS. 10A to 10C can be manufactured by using the above-described method for manufacturing a transistor and a display device as appropriate.

Example 1

The present inventors have made researches about optimal conditions in irradiating a single crystal semiconductor substrate with ions, in order to manufacture an SOI substrate with high yield. In this example, results of the researches will be described.

(Manufacturing Method of Sample)

First, thermal oxidation treatment was performed on a single crystal silicon substrate with a size of 5 inches square so that an oxide film containing chlorine was formed on a surface of the single crystal silicon substrate. The thermal oxidation treatment was performed so that the thickness of the oxide film containing chlorine was 100 nm. Specifically, the thermal oxidation treatment was performed at 950° C. for 210 minutes in an oxidizing atmosphere in which hydrogen chloride (HCl) was contained by 3 volume % with respect to oxygen.

Next, the single crystal silicon substrate was irradiated with hydrogen ions through the oxide film, whereby an embrittled region was formed. Samples each in which an embrittled region was formed using an ion doping apparatus (samples 1 to 4, a comparative sample 1, and a comparative sample 3) and a sample in which an embrittled region was formed using an ion implantation apparatus (a comparative sample 2) were prepared in the formation of the embrittled region.

A 100% hydrogen gas was used as a source gas for the samples for which an ion doping apparatus was used (the samples 1 to 4 and the comparative samples 1 and 3), and the hydrogen gas was excited so as to generate plasma. The generated plasma included three kinds of ion species ($H^+$, $H_2^+$, and $H_3^+$). These ion species were accelerated by an electric field without mass separation to irradiate the single crystal silicon substrate. Note that approximately 70% of the ion species that were generated from the hydrogen gas was $H_3^+$. The flow rate of the hydrogen gas was 50 sccm. The acceleration voltage was 50 kV.

A 100% $PH_3$ gas was used as a source gas for the sample for which an ion implantation apparatus was used (the comparative sample 2), and the $PH_3$ gas was excited so as to generate plasma. The generated plasma included three kinds of ion species ($H^+$, $H_2^+$, and $H_3^+$). These ion species were mass-separated, and the single crystal silicon substrate was irradiated with only H. The flow rate of the $PH_3$ gas was 0.75 sccm. The acceleration voltage was 17 kV.

As conditions of the ion irradiation, the total number (dose) of ions with which the samples 1 to 4 and the comparative sample 1 were irradiated was $2.5 \times 10^{16}$ $cm^{-2}$. The total number (dose) of ions with which the comparative sample 2 was irradiated was $5.0 \times 10^{16}$ $cm^{-2}$. The total number (dose) of ions with which the comparative sample 3 was irradiated was $1.7 \times 10^{16}$ $cm^{-2}$. As a supporting base of the single crystal silicon substrate, an electrostatic chuck was used for the comparative sample 1 and a mechanical chuck was used for the other samples. Table 1 shows the current density of the ion species and the temperature of the single crystal silicon substrate at the time of the ion irradiation, in the samples 1 to 4 and the comparative samples 1 and 3. Note that the temperature of the single crystal silicon substrate was measured using an irreversible thermolabel (manufactured by Thermographic Measurements Ltd. (TMC), product name: THERMAX 6 Level Mini Strips) whose portion for indication of temperature changes its color at a specific temperature.

The electrostatic chuck has a mechanism in which a dielectric layer is provided on a surface of the supporting base, voltage is applied between the supporting base and the single crystal silicon substrate, and the single crystal silicon substrate is stuck with the use of force generated between the supporting base and the single crystal silicon substrate. The electrostatic chuck is formed using a material having high thermal conductivity, and is provided with high cooling capability with respect to the single crystal silicon substrate. On the other hand, as compared with the electrostatic chuck, the mechanical chuck has lower ability for sticking the single crystal silicon substrate, and thus cooling effect on the single crystal silicon substrate is low.

When the other measurement conditions are the same, the higher the current density of the ion species is, the higher the temperature of the substrate at the time of the ion irradiation becomes.

TABLE 1

| Kind of Sample | Supporting Base of Substrate | Current Density of Ion Species ($\mu A/cm^2$) | Mass Separation | Temperature of Substrate in Ion Irradiation (° C.) |
|---|---|---|---|---|
| sample 1 | mechanical chuck | 3 | not performed | 240 to 250 |
| sample 2 | mechanical chuck | 4.5 | not performed | about 310 |
| sample 3 | mechanical chuck | 6.35 | not performed | about 320 |
| sample 4 | mechanical chuck | 12.7 | not performed | about 390 |
| comparative sample 1 | electrostatic chuck | 6.35 | not performed | about 120 |
| comparative sample 3 | electrostatic chuck | 6.35 | not performed | about 120 |

Table 2 shows the beam current of ions (H) and the temperature of the single crystal silicon substrate at the time of the ion irradiation, in the comparative sample 2.

TABLE 2

| Kind of Sample | Supporting Base of Substrate | Beam Current of Ions ($\mu A$) | Mass Separation | Temperature of Substrate in Ion Irradiation (° C.) |
|---|---|---|---|---|
| comparative sample 2 | mechanical chuck | 250 | performed | room temperature (higher than or equal to 20 and lower than or equal to 30) |

Figure 11:
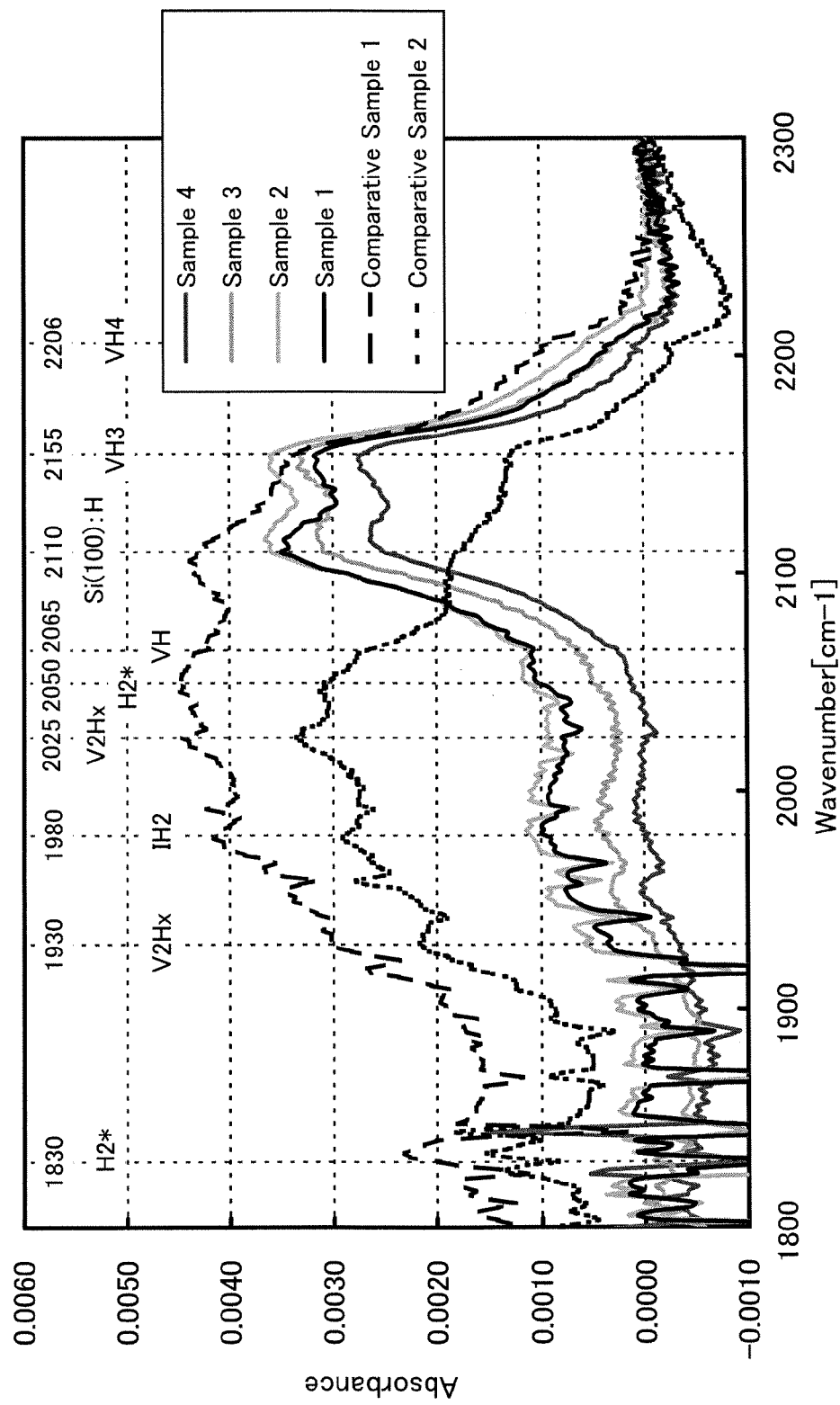
FIG. 11 shows evaluation results of an embrittled region by FT-IR.

Next, evaluation of a Si—H bond in the embrittled region of each sample (the samples 1 to 4 and the comparative samples 1 and 2) was performed using Fourier Transform Infrared Spectroscopy (FT-IR). FIG. 11 shows the evaluation results. In FIG. 11, the vertical axis indicates absorbance (arbitrary unit) and the horizontal axis indicates a wavenumber ($cm^{-1}$).

As shown in FIG. 11, each of the samples 1 to 4 had a maximum peak around 2110 $cm^{-1}$ or around 2155 $cm^{-1}$, and had no other significant peak. Here, it is considered that the peak around 2110 $cm^{-1}$ derives from a hydrogen atom bonded to silicon which exists in a (100) plane platelet defect and the peak around 2155 $cm^{-1}$ derives from three hydrogen atoms (denoted by VH3 in FIG. 11) filling one microvoid. On the other hand, the comparative sample 1 had a peak around 1830 $cm^{-1}$, 1930 $cm^{-1}$, 1980 $cm^{-1}$, 2025 $cm^{-1}$, 2050 $cm^{-1}$, 2065 $cm^{-1}$, and 2206 $cm^{-1}$ and did not have a maximum peak around 2110 $cm^{-1}$ or around 2155 $cm^{-1}$. The comparative sample 2 also did not have a maximum peak around 2110 $cm^{-1}$ or around 2155 $cm^{-1}$. Thus, difference in spectrum can be accurately read by comparing the samples 1 to 4 with the comparative sample 1 or 2.

Then, after a glass substrate was bonded to each of the sample 3 and the comparative samples 2 and 3, the single crystal silicon substrate and the glass substrate were separated at the embrittled region and a silicon layer was formed over the glass substrate with the oxide film containing chlorine therebetween. Note that AN100 which is a glass substrate manufactured by Asahi Glass Co., Ltd. was used as the glass substrate. For heat treatment at the time of the separation, a vertical heating furnace was used, and annealing was performed at 200° C. for 1 hour and then at 600° C. for 2 hours.

Figure 12:
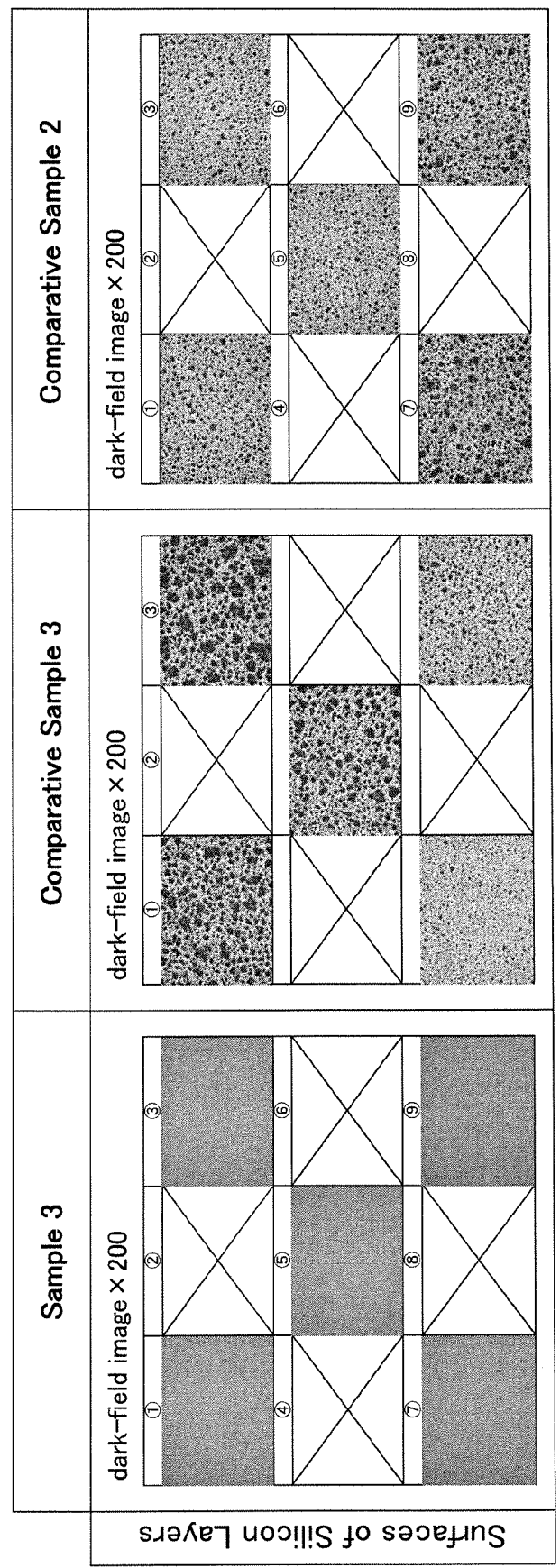
FIG. 12 shows observation results of a surface of a silicon layer.

Next, dark-field images of surfaces of the silicon layers formed using the sample 3 and the comparative samples 2 and 3 were observed using an optical microscope. FIG. 12 shows the observation results. The observation magnification was 200 times. The observed regions of each sample were the center of the substrate and regions (4 places) each of which are about 6 cm away from the center.

As shown in FIG. 12, the silicon layer formed using the sample 3 had less unevenness on its surface as compared with the silicon layers formed using the comparative samples 2 and 3.

After that, the average surface roughness (Ra) and the maximum peak-to-valley height (P-V) of each of the silicon layers formed using the sample 3 and the comparative sample 3 were measured using an atomic force microscope (AFM). Table 3 shows the measurement results. Note that 4 samples were prepared for both the sample 3 and the comparative sample 3, which are denoted by samples 3-1 to 3-4 and comparative samples 3-1 to 3-4 in Table 2. The average surface roughness (Ra) is obtained by three-dimension expansion of center line average surface roughness Ra which is defined by JISB0601:2001 (ISO 4287:1997) so that Ra can be applied to a measurement surface, and is an average value of the absolute values of deviations from a reference surface to a specific surface. The maximum peak-to-valley height (P-V) is a difference between the height of the highest peak and the height of the lowest valley in the specific surface. The peak and the valley refer to a peak and a valley obtained by three-dimensional expansion of the "peak" and the "valley" defined by JISB0601:2001 (ISO 4287:1997). The peak refers to the highest point of the peaks in the specific surface. The valley refers to the lowest point of the valleys in the specific surface.

TABLE 3

| Kind of Sample | Average Surface Roughness (nm) | Maximum Peak-to-Valley Height (P-V) |
| --- | --- | --- |
| sample 3-1 | 8.121 | 164.8 |
| sample 3-2 | 7.114 | 162.0 |
| sample 3-3 | 7.289 | 148.8 |
| sample 3-4 | 7.371 | 174.8 |
| comparative sample 3-1 | 8.842 | 244.2 |
| comparative sample 3-2 | 9.035 | 256.2 |
| comparative sample 3-3 | 9.115 | 251.2 |
| comparative sample 3-4 | 9.266 | 267.7 |

As shown in Table 3, the silicon layer formed using the sample 3 had extremely smaller average surface roughness (Ra) and maximum peak-to-valley height (P-V) as compared with the silicon layer formed using the comparative sample 3.

Next, the number of defects on the surface of each of the silicon layers formed using the sample 3 and the comparative samples 2 and 3 was measured. Table 4 shows the measurement results obtained by using a surface inspection device manufactured by Hitachi High-Technologies Corporation (product name: GI-4600). In Table 4, the defects are divided into S, M, and L in accordance with size, and S indicates the number of defects having a size greater than or equal to 1 µm and less than 3 µm, M indicates the number of defects having a size greater than or equal to 3 µm and less than 5 µm, and L indicates the number of defects having a size greater than or equal to 5 µm. In Table 4, the total number of dusts is the sum of S, M, and L.

TABLE 4

| Kind of Sample | S | M | L | Total Number of Dusts |
| --- | --- | --- | --- | --- |
| sample 3 | 12 | 7 | 2 | 21 |
| comparative sample 1 | 2738 | 14 | 2 | 2754 |
| comparative sample 2 | 7591 | 2374 | 2 | 9967 |

As shown in Table 4, the silicon layer formed using the sample 3 had an extremely smaller number of defects on its surface as compared with the silicon layers formed using the comparative samples 2 and 3.

From the above results, it was found that each of the silicon layers formed using the samples 1 to 4 was a film having fewer defects and less unevenness on its surface as compared with the silicon layer formed using the comparative sample 1, 2, or 3. Accordingly, it can be said that in order to manufacture an SOI substrate with high yield, it is preferable to use ion species which are not mass-separated at the time of ion irradiation and to set the temperature of a single crystal semiconductor substrate to 250° C. or higher at the time of the ion irradiation. It can also be said that in a step of forming an embrittled region, irradiation with hydrogen ions is preferably performed so that there is a peak around 2110 cm$^{-1}$ or around 2155 cm$^{-1}$ when evaluation of a Si—H bond in the embrittled region is performed by Fourier transform infrared spectroscopy.

This application is based on Japanese Patent Application serial no. 2010-014862 filed with Japan Patent Office on Jan. 26, 2010, the entire contents of which are hereby incorporated by reference.

What is claimed is:

1. A method for manufacturing an SOI substrate comprising the steps of:
    irradiating a single crystal semiconductor substrate with ions to form an embrittled region in the single crystal semiconductor substrate;
    bonding the single crystal semiconductor substrate to a base substrate with an insulating film therebetween; and
    separating the single crystal semiconductor substrate at the embrittled region to form a semiconductor layer over the base substrate with the insulating film therebetween,
    wherein in the step of forming the embrittled region, ion species which are not mass-separated are used as the ions and a temperature of the single crystal semiconductor substrate is set to 250° C. or higher at the time of irradiation with the ions.

2. The method for manufacturing the SOI substrate according to claim 1, wherein ions including a hydrogen element are used as the ions and a proportion of $H_3^+$ is 70% or higher with respect to the total number of the ions.

3. The method for manufacturing the SOI substrate according to claim 1, wherein a temperature of the single crystal semiconductor substrate is set to be higher than or equal to 250° C. and lower than or equal to 400° C. at the time of irradiating with the ions.

4. The method for manufacturing the SOI substrate according to claim 1, wherein a glass substrate is used as the base substrate.

5. The method for manufacturing the SOI substrate according to claim 1, wherein the semiconductor layer is formed of a single crystal.

6. A method for manufacturing an SOI substrate comprising the steps of:
- irradiating a single crystal silicon substrate with hydrogen ions to form an embrittled region in the single crystal silicon substrate;
- bonding the single crystal silicon substrate to a base substrate with an insulating film therebetween; and
- separating the single crystal silicon substrate at the embrittled region to form a silicon layer over the base substrate with the insulating film therebetween,
- wherein a temperature of the single crystal silicon substrate is set to 250° C. or higher at the time of irradiation with the hydrogen ions, and
- wherein in the step of forming the embrittled region, irradiating with the hydrogen ions is performed so that there is a maximum peak around 2110 cm$^{-1}$ or 2155 cm$^{-1}$ when evaluation of a Si—H bond in the embrittled region is performed by Fourier transform infrared spectroscopy.

7. The method for manufacturing the SOI substrate according to claim 6, wherein a proportion of $H_3^+$ is 70% or higher with respect to the total number of the hydrogen ions.

8. The method for manufacturing the SOI substrate according to claim 6, wherein a temperature of the single crystal silicon substrate is set to be higher than or equal to 250° C. and lower than or equal to 400° C. at the time of irradiating with the hydrogen ions.

9. The method for manufacturing the SOI substrate according to claim 6, wherein a glass substrate is used as the base substrate.

10. The method for manufacturing the SOI substrate according to claim 6, wherein the silicon layer is formed of a single crystal.

11. A method for manufacturing an SOI substrate comprising the steps of:
- forming an insulating film on at least one surface of a single crystal semiconductor substrate;
- irradiating the single crystal semiconductor substrate with ions through the insulating film to form an embrittled region in the single crystal semiconductor substrate;
- bonding the single crystal semiconductor substrate to a base substrate with the insulating film therebetween; and
- separating the single crystal semiconductor substrate at the embrittled region to form a semiconductor layer over the base substrate with the insulating film therebetween,
- wherein in the step of forming the embrittled region, ion species which are not mass-separated are used as the ions and a temperature of the single crystal semiconductor substrate is set to 250° C. or higher at the time of irradiation with the ions.

12. The method for manufacturing the SOI substrate according to claim 11, wherein the insulating film is formed by thermal oxidation of at least one surface of the single crystal semiconductor substrate.

13. The method for manufacturing the SOI substrate according to claim 11, wherein ions including a hydrogen element are used as the ions and a proportion of $H_3^+$ is 70% or higher with respect to the total number of the ions.

14. The method for manufacturing the SOI substrate according to claim 11, wherein a temperature of the single crystal semiconductor substrate is set to be higher than or equal to 250° C. and lower than or equal to 400° C. at the time of irradiating with the ions.

15. The method for manufacturing the SOI substrate according to claim 11, wherein a glass substrate is used as the base substrate.

16. The method for manufacturing the SOI substrate according to claim 11, wherein the semiconductor layer is formed of a single crystal.

17. A method for manufacturing an SOI substrate comprising the steps of:
- irradiating a single crystal semiconductor substrate with ions to form an embrittled region in the single crystal semiconductor substrate;
- forming an insulating film over a base substrate;
- bonding the single crystal semiconductor substrate to the base substrate with the insulating film therebetween; and
- separating the single crystal semiconductor substrate at the embrittled region to form a semiconductor layer over the base substrate with the insulating film therebetween,
- wherein in the step of forming the embrittled region, ion species which are not mass-separated are used as the ions and a temperature of the single crystal semiconductor substrate is set to 250° C. or higher at the time of irradiation with the ions.

18. The method for manufacturing the SOI substrate according to claim 17, wherein ions including a hydrogen element are used as the ions and a proportion of $H_3^+$ is 70 or higher with respect to the total number of the ions.

19. The method for manufacturing the SOI substrate according to claim 17, wherein a temperature of the single crystal semiconductor substrate is set to be higher than or equal to 250° C. and lower than or equal to 400° C. at the time of irradiating with the ions.

20. The method for manufacturing the SOI substrate according to claim 17, wherein a glass substrate is used as the base substrate.

21. The method for manufacturing the SOI substrate according to claim 17, wherein the semiconductor layer is formed of a single crystal.

* * * * *